US006457882B2

(12) United States Patent
Ogata et al.

(10) Patent No.: US 6,457,882 B2
(45) Date of Patent: Oct. 1, 2002

(54) SUBSTRATE PROCESSING METHOD AND SUBSTRATE PROCESSING APPARATUS

(75) Inventors: Kunie Ogata, Tokyo-To; Ryouichi Uemura, Kumamoto-Ken; Masanori Tateyama, Kumamoto-Ken; Yoshiyuki Nakajima, Kumamoto-Ken, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/803,966

(22) Filed: Mar. 13, 2001

(30) Foreign Application Priority Data

Mar. 14, 2000 (JP) ........................ 2000-069813
Mar. 14, 2000 (JP) ........................ 2000-070868

(51) Int. Cl.[7] ........................ G03D 5/00; G03D 13/00
(52) U.S. Cl. ........................ 396/578; 396/604; 396/611; 396/622
(58) Field of Search ........................ 396/604, 611, 396/578, 626; 430/30; 356/355–357, 444; 156/626

(56) References Cited

U.S. PATENT DOCUMENTS 5,393,624 A * 2/1995 Ushijima ................... 430/30
5,843,527 A * 12/1998 Sanada ...................... 427/240
5,939,139 A   8/1999 Fujimoto ................... 427/240
5,976,620 A * 11/1999 Sanada et al. ............. 427/240
6,004,047 A  12/1999 Akimoto et al. ............ 396/611

FOREIGN PATENT DOCUMENTS

JP          9-82608        * 3/1997

* cited by examiner

*Primary Examiner*—D. Rutledge
(74) *Attorney, Agent, or Firm*—Oblon, Spivak, McClelland, Maier & Neustadt, P.C.

(57) ABSTRACT

A substrate processing method for forming a resist film on a wafer with a base film being formed, and performing an exposure processing and a developing processing for the resist film to thereby form a desired resist pattern, has a base reflected light analyzing step of radiating a light of the same wavelength as an exposure light radiated during the exposure processing to the base film and analyzing a reflected light, before forming the resist film, and a processing condition control step of controlling at least one of a resist film forming condition and an exposure processing condition, based on the analysis of the reflected light. The method makes it possible to control a line width of a resist pattern with high precision.

39 Claims, 21 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for forming a desired resist pattern on a front face of a substrate such as a semiconductor wafer and an LCD substrate.

2. Description of the Related Art

For example, in a photolithography process in semiconductor device fabrication, a resist film is formed on a front surface of a semiconductor wafer (hereinafter called "a wafer") and after exposure processing is performed, developing processing is performed, whereby a predetermined resist pattern is formed.

Such a photolithography process is performed by transferring a wafer to and from a resist coating unit for forming a resist film on the wafer, an exposure processing unit for performing exposure processing for the wafer, and a developing processing unit for performing developing processing for the wafer after the exposure processing.

By the way, in recent years, a demand for miniscule resist patterns formed on the front faces of wafers has been increased, and hence it is required to control the line width of a resist pattern more tightly. Conventionally, the line width of a resist pattern is controlled in such a manner as, for example, an operator actually measures the line width of a resist pattern on the front face of a wafer transferred from the resist coating and developing system by using an SEM, then determines whether or not the line width is included in the range of the specifications, and feeds the determination results back to the processing condition of each processing unit.

However, the aforementioned method has the disadvantages of requiring an expensive SEM, and much time and effort for measuring a line width. Further, on measuring a line width by using the SEM, the wafer has to be temporally carried out and transferred into the vacuum sample chamber, thus causing the disadvantage of the wafer being contaminated.

SUMMARY OF THE INVENTION

An object of the present invention is to provide a substrate processing method and a substrate processing apparatus capable of controlling the line width of a resist pattern with high precision.

According to a first aspect of the present invention, a substrate processing method for forming a resist film on a substrate with a base film being formed, and performing an exposure processing and a developing processing for the resist film to thereby form a desired resist pattern, comprises a base reflected light analyzing step of radiating a light of the same wavelength as an exposure light radiated during the exposure processing to the base film and analyzing a reflected light, before forming the resist film, and a processing condition control step of controlling at least one of a resist film forming condition, a condition for a heating processing performed after the resist film is formed, an exposure processing condition and a developing processing condition, based on an analysis of the reflected light.

The present invention is made in view of the fact that the exposure light is reflected on the base film on exposure, and this exerts an influence on the exposure, whereby the line width of the resist pattern is varied.

For example, $SiO_2$ and A1 with different light reflectivity are formed as the base film on a semiconductor wafer as a substrate, the ratio of the area with $SiO_2$ and the area with A1 differs according to the circuit pattern to be formed, and the reflectivity state of a light on the base film differs according to the ratio. Consequently, if the resist pattern is formed under the same condition, the line width of the resist pattern differs according to the reflectivity of the light on the base film.

Thus, in the present invention, by measuring the reflectively of the base film with a light of the same wavelength as the exposure light, an influence that the base film exerts on the exposure amount during the exposure is accurately found, thereby controlling the resist coating condition and the exposure condition.

It should be noted that even with use of the light of the same wavelength as the exposure light, the radiation is performed before the resist film is formed, thus causing no adverse effects on the resist pattern.

According to a second aspect of the present invention, a substrate processing method for forming a resist film on a substrate with a base film being formed, and performing an exposure processing and a developing processing for the resist film to thereby form a desired resist pattern, comprises a base reflected light analyzing step of radiating a light of multiple wavelengths to the base film and analyzing a component of the same wavelength as an exposure light radiated during the exposure processing out of the reflected lights before forming the resist film, and a condition control step of controlling at least one of a resist film forming condition, a condition for heating processing performed after the resist film is formed, an exposure processing condition and a developing processing condition, based on the analysis of the reflected light.

According to the above configuration, by using the light of multiple wavelengths, even when the wavelength of the exposure light varies, the component of the same wavelength as the exposure light is analyzed out of the reflected lights, thus making it possible to find an influence that the state of the base film exerts on the line width of the resist pattern.

According to a third aspect of the present invention, a substrate processing method for forming a resist film on a substrate with at least a base film being formed and transferring the substrate to an aligner, comprises a base reflected light analyzing step of radiating a light of the same wavelength as an exposure light in the aligner and analyzing a reflected light before forming the resist film, a step for obtaining an optimal exposure processing condition in the aligner based on an analysis of the reflected light, and a step of outputting the obtained optimal exposure processing condition to the aligner side. Thereby, the line width of the resist pattern can be controlled with high precision.

According to a fourth aspect of the present invention, a substrate processing method for forming a resist film on a substrate with a base film being formed, and performing an exposure processing and a developing processing for the resist film to thereby form a desired resist pattern, comprises a step of radiating a light of the same wavelength as an exposure light radiated during the exposure processing to the base film and controlling at least one of a resist film forming condition and an exposure processing condition based thereon, and a step of measuring a resist film thickness with use of a light of a different wavelength from the exposure light radiated during the exposure processing, after forming the resist film.

According to the above configuration, the light of the same wavelength as the exposure light is used before the resist film is formed, but after the resist film is formed, the light of a different wavelength from the exposure light is used, and thus various kinds of measurements can be performed without having adverse effects on the resist pattern.

According to a fifth aspect of the present invention, a substrate processing method for supplying a coating solution to a substrate and rotating the substrate to thereby spread the coating solution by a centrifugal force of the rotation, then further rotating the substrate to thereby spin-dry the coating solution, comprising:

a correlation calculating step of forming coating films at a plurality of spin rotational frequencies in a predetermined range based on a set target film thickness, and based thereon, obtaining a correlation between the spin rotational frequency and the film thickness, a judging step of judging whether the target film thickness is included in a range of the coating film obtained in the above step, a spin rotational frequency calculating step of applying the target film thickness to the correlation when it is judged that the target film thickness is included in the range in the judging step, and obtaining a spin rotational frequency by which the film thickness is achieved.

According to the above configuration, by only inputting and setting a desired resist film thickness, the rotational frequency of the spin chuck can be set. Further, in the present invention, in view of the fact that the rotational frequency during spin-dry rather than the rotational frequency during spreading of the resist solution exerts the greatest influence on the formation of the film thickness, the spin rotational frequency is set according to the film thickness of the resist film. This makes it possible to perform the control of the film thickness accurately, and as the result, the line width of a resist pattern can be favorably controlled.

According to a sixth main aspect of the present invention, a substrate processing apparatus for forming a resist film on a substrate with a base film being formed and performing a heat processing therefor, then transferring the substrate to an aligner, and performing a developing processing for the substrate received from the aligner to thereby form a desired resist pattern comprises a base reflected light analyzing device for radiating a light of the same wavelength as an exposure light radiated during an exposure processing to the base film, and a processing condition controller for controlling at least one of a resist film forming condition, a condition for the heating processing, an exposure processing condition, and a developing processing condition based on an analysis of the reflected light.

According to the above configuration, the reflection of the base film is measured with the light of the same wavelength as the exposure light, whereby the influence that the base film exerts on the exposure amount is accurately found, thereby making it possible to control the resist coating condition and the exposure condition.

According to a seventh aspect of the present invention, a substrate processing apparatus for forming a resist film on a substrate with a base film being formed and performing a heat processing therefor, then transferring the substrate to an aligner, and performing a developing processing for the substrate received from the aligner to thereby form a desired resist pattern, comprises a base reflected light analyzing device for radiating a light of multiple wavelengths to the base film and analyzing a component of the same wavelength as an exposure light radiated during an exposure processing, out of reflected lights, and a processing condition controller for controlling at least one of a resist film forming condition, a condition for the heating processing, an exposure processing condition, and a developing processing condition based on an analysis of the reflected light.

According to the above configuration, as a result of utilizing the light of multiple wavelengths, even when the wavelength of the exposure light varies, the component of the same wavelength as the exposure light out of the reflected lights is analyzed, thus making it possible to find the influence that the state of the base film exerts on the line width of the resist pattern.

According to an eighth aspect of the present invention, a substrate processing apparatus for forming a resist film on a substrate with at least a base film being formed and transferring the substrate to an aligner comprises a base reflected light analyzing device for radiating a light of the same wavelength as an exposure light in the aligner and analyzing the reflected light before forming the resist film, an exposure processing condition calculating device for obtaining an optimal exposure processing condition in the aligner based on an analysis of the reflected light, and an output device for outputting the obtained optimal exposure processing condition to the aligner side.

According to a ninth aspect of the present invention, a substrate processing apparatus for holding a substrate on a substrate holder rotated by a driving device, supplying a coating solution to the substrate and rotating the substrate, and spreading the coating solution by a centrifugal force of the rotation to thereby form a coating film comprises a substrate rotation speed setting unit for setting a spin-rotation speed for the coating solution, and the rotation speed setting unit comprises a target film thickness setting device for setting a target film thickness of the coating film, a spin rotational frequency–film thickness correlation storage device for storing a correlation between the spin rotational frequency and the film thickness of the coating film achieved thereby, and a spin rotational frequency calculating device for applying the target film thickness set by the film thickness setting device to the correlation stored in the spin rotational frequency–film thickness correlation storage device, and calculating the spin rotational frequency for achieving the target film thickness based thereon.

According to the above configuration, only by inputting and setting a desired resist film thickness, the rotational frequency of the spin chuck can be set. Further, in the present invention, in view of the fact that the rotational frequency during the spin-dry rather than the rotational frequency during the spreading of the resist solution exerts the greatest influence on the formation of the film thickness, the spin rotational frequency is set according to the film thickness of the resist film. Hence, it becomes possible to perform the control of the film thickness accurately, and as the result, the line width of the resist pattern can be favorably controlled.

According to the one embodiment, it is preferable that the apparatus further comprises a film thickness measuring device for measuring the film thickness of the coating film formed by the coating film forming unit, and a correlation calculating device for obtaining a correlation between the rotational frequency and the film thickness of the coating film obtained thereby based on a film thickness of the coating film measured by the film thickness measuring device.

According to the above configuration, the correlation between the spin rotational frequency of the coating solution and the film thickness is obtained at the time of deriving the condition before the mass production process, and with use of this, the spin rotational frequency can be set. As a result, it becomes possible to set the spin rotational frequency without depending on the empirical value of an operator and the like.

Further, according to the other one embodiment, it is desirable that the correlation calculating device obtains the correlation based on the film thickness of the coating film formed at each rotational frequency after the coating films are formed at a plurality of spin rotational frequencies in a predetermined range.

According to the above configuration, the correlation is obtained only by making the spin-motion a plurality of times in a predetermined narrow condition deriving range, thus making it possible to finish deriving the condition and setting the spin rotational frequency in a comparatively short time.

However, in this case, it is preferable that the film thickness setting device determines whether the target film thickness is included in a range of the film thickness of the coating film obtained at spin rotational frequencies in the predetermined range, and makes the correlation calculating device obtain the correlation once again with the range of the spin rotational frequency being shifted, when the target film thickness is not included therein.

According to the above configuration, when the desired film thickness is not included in the predetermined range, the correlation can be obtained once again, thereby making it possible to set the spin rotational frequency more accurately. It is preferable that the shifting amount of the range of the spin rotation frequency is automatically calculated from the correlation already obtained.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, embodiments of the present invention will be explained with reference to the drawings.

Figure 1:
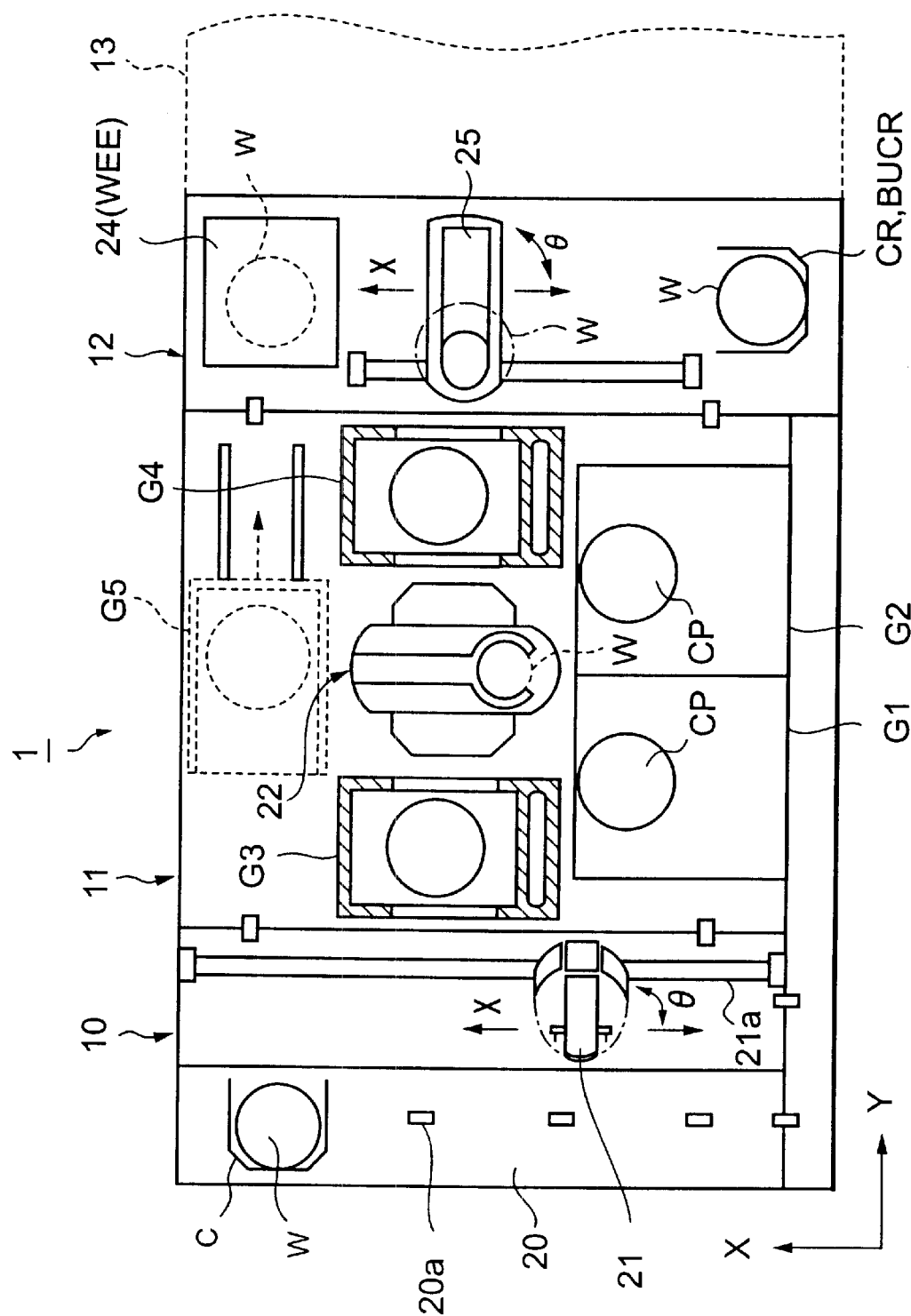
FIG. 1 is a plan view showing a resist coating and developing system according to an embodiment of the present invention.

As shown in FIG. 1, a resist coating and developing system 1 has the configuration in which a cassette station 10, a processing station 11 and an interface section 12 are integrally connected in a system for coating a semiconductor wafer with a chemical amplifying resist and developing the same.

In the cassette station 10, as shown in FIG. 1, a plurality of (for example, four) cassettes C are mounted in a line along an X-direction (a vertical direction in FIG. 1) with respective transfer ports for the wafer W facing the processing station 11 side at positions of positioning projections 20a on a cassette mounting table 20. A wafer carrier device 21 movable in the direction of arrangement of the cassettes C (the X-direction) and in the direction of arrangement of the wafers W housed in the cassette C (a Z-direction; vertical direction) is provided movably along a carrier path 21a, and is structured to be selectively accessible to each of the cassettes C.

The wafer carrier device 21 is also structured to be rotatable in a θ-direction so as to be accessible to an alignment unit (ALIM) and an extension unit (EXT) included in a multistage unit section of a third processing unit group G3 at the processing station 11 side as will be described later.

In the aforementioned processing station 11, as shown in FIG. 1, a vertical carrier type of main carrier device 22 is provided in the center portion thereof, around which a pair of or a plurality of pairs of various processing units as processing chambers are multi-tiered to define a processing unit group. In the resist coating and developing system 1 in this embodiment, five processing unit groups G1, G2, G3, G4, and G5 are arranged. The first and the second processing unit group G1 and G2 are arranged on the front side of the system, the third processing unit group G3 is arranged adjacent to the cassette station 10, and the fourth processing unit group G4 is arranged adjacent to the interface section 12. Moreover, the fifth processing unit group G5 shown by the broken line is arranged on the rear side. The main carrier device 22 is structured to be rotatable in the θ-direction and movable in the Z-direction, and transfers the wafer W to and from each of the processing unit groups G1 to G5.

Figure 2:
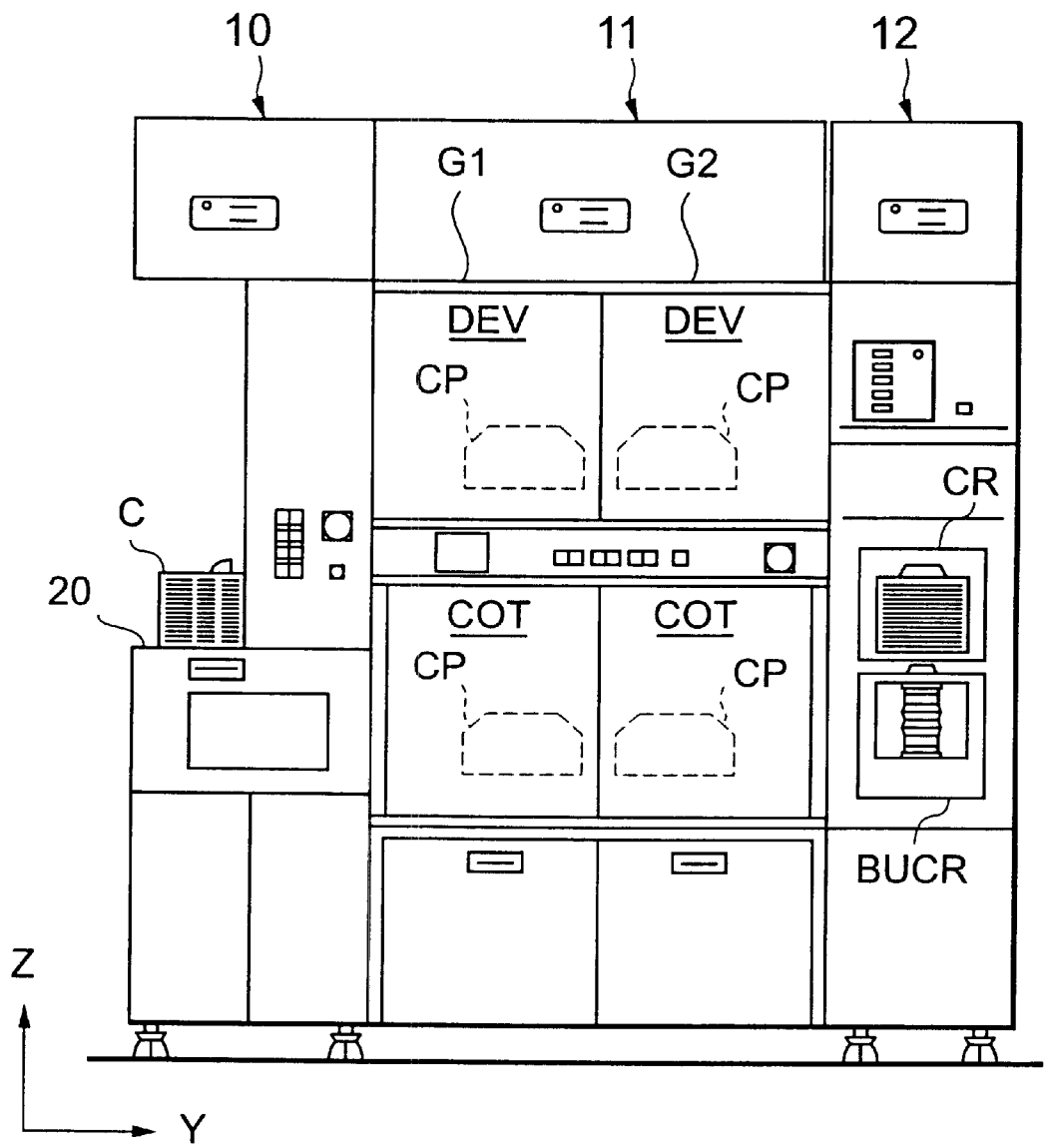
FIG. 2 is a front view of the resist coating and developing system shown in FIG. 1.
Figure 10:
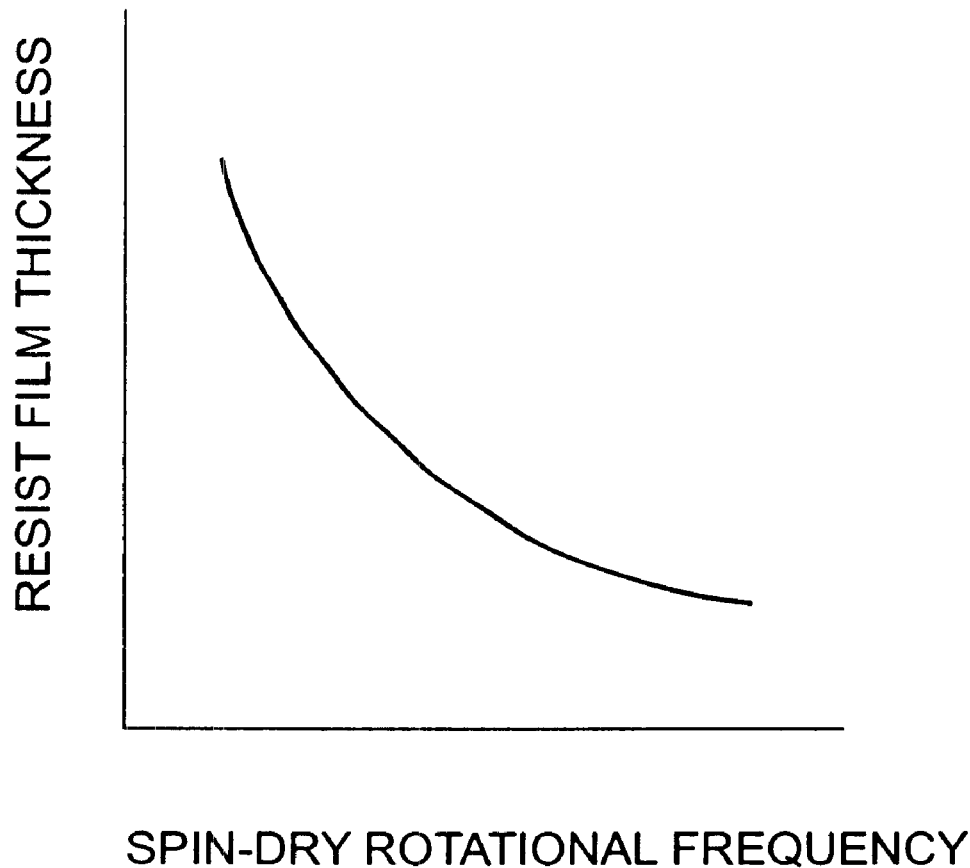
FIG. 10 is a graph showing an example of relation between resist film thickness and spin rotational frequency.
Figure 11:
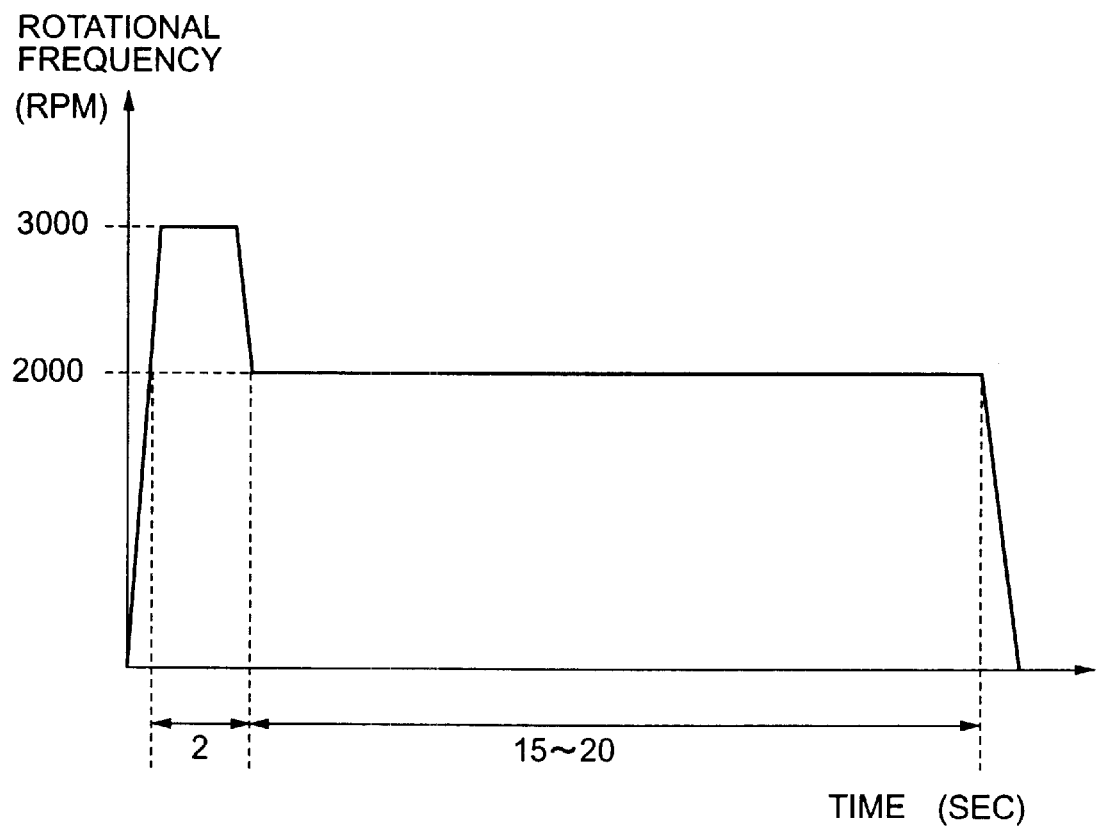
FIG. 11 is an explanatory diagram of a processing content in a resist coating unit.

As shown in FIG. 2, in the first processing unit group G1, two spinner type of processing units, for example, a resist solution coating unit (COT) and a developing processing unit (DEV) in which predetermined processing is performed with the wafer W being placed on a spin chuck inside a cup CP are vertically two-tiered. As in the first processing unit group G1, in the second processing unit group G2, two spinner type of processing units, for example, a resist coating unit (COT) and a developing unit (DEV) are also vertically two-tiered. In the resist coating unit (COT), while the wafer W is rotated, for example, at about 3000 rpm by means of the spin chuck, a resist solution is supplied to its center from a nozzle, for example, as shown in FIG. 10. The supply of the resist solution is stopped, for example, two seconds thereafter, and the wafer W is rotated at about 2000 rpm to perform spin-dry for about 15 seconds to 20 seconds. The configuration of the resist solution coating unit (COT) will be described later.

Figure 3:
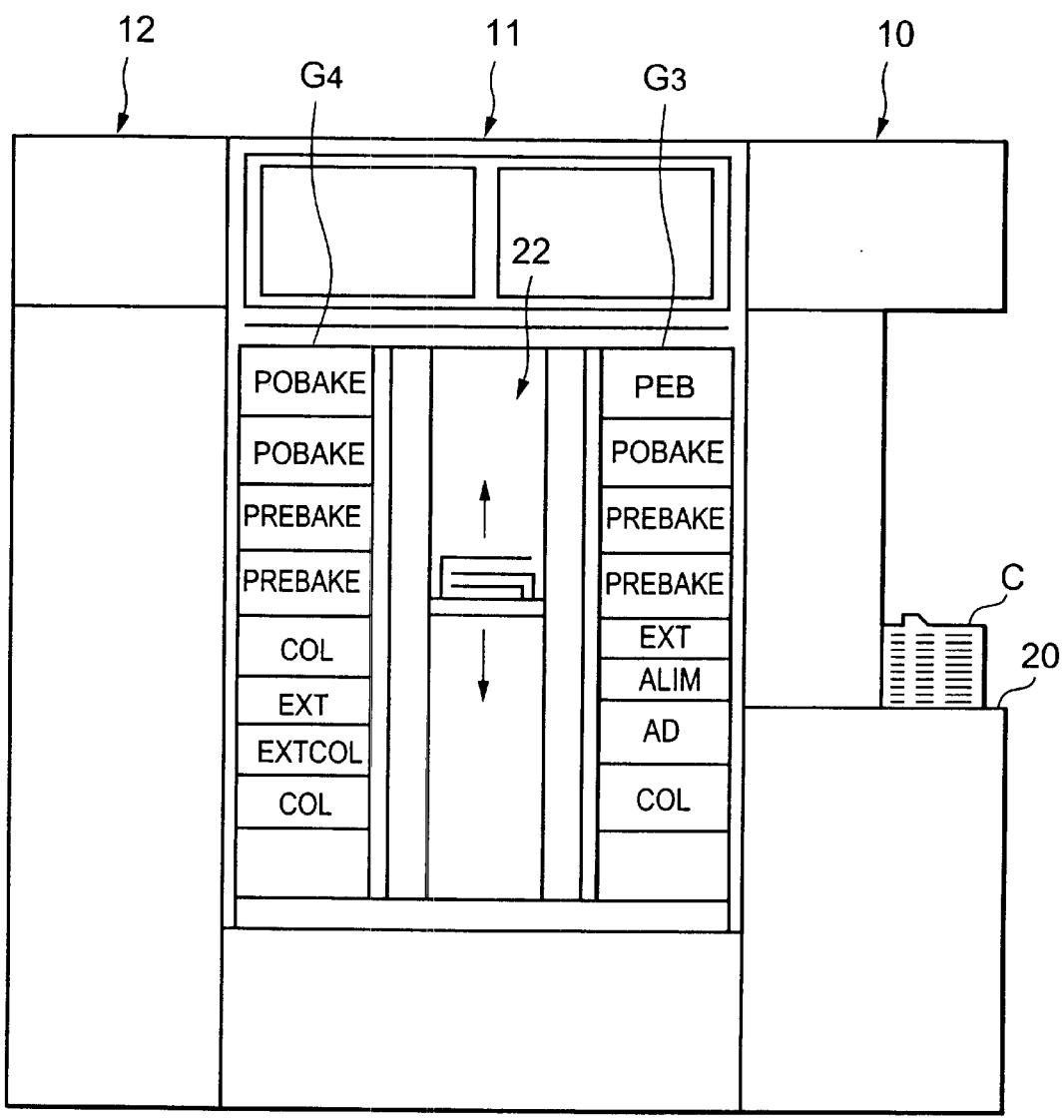
FIG. 3 is a rear view of the resist coating and developing system shown in FIG. 1.

As shown in FIG. 3, in the third processing unit group G3, oven type of processing units each for performing predetermined processing with the wafer W being placed on a mounting table (not shown), for example, a cooling processing unit (COL) for performing cooling processing, an adhesion processing unit (AD) for performing so-called hydrophobic processing to enhance fixedness of the resist, an alignment unit (ALIM) for performing positioning, an extension unit (EXT), a prebaking unit (PREBAKE) for performing heating processing before exposure processing, a post-baking unit (POBAKE), and a post-exposure baking unit (PEB) are, for example, eight-tired from the bottom.

Also in the fourth processing unit group G4, oven type of processing units each for performing predetermined processing with the wafer W being placed on a mounting table, for example, a cooling processing unit (COL), an extension and cooling unit (EXTCOL) for also performing cooling processing, an extension unit (EXT), an adhesion unit (AD), a prebaking unit (PREBAKE), and a post-baking unit (POBAKE) are, for example, eight-tiered from the bottom.

As shown in FIG. 1, the interface section 12 has the same length as the aforementioned processing station 11 in a depth direction (the X-direction), but it is set to have a smaller length in a width direction. As shown in FIG. 1 and FIG. 2, a transportable pickup cassette CR and a fixed type of buffer cassette (BUCR) are two-tiered at the front of the interface section 12, while an edge aligner 24 (WEE) is disposed at the rear.

A wafer carrier device 25 is provided at the center portion of the aforementioned interface section 12. The wafer carrier device 25 moves in the X-direction and Z-direction (vertical direction) to be accessible to both of the cassettes CR and BUCR, and the edge aligner 24 (WEE). The wafer carrier device 25 is structured to be also rotatable in the θ-direction so as to be accessible to the extension unit (EXT) included in the fourth processing unit group G4 of the processing station 11 and also to a wafer delivery table (not shown) on the adjacent aligner 13 side.

Figure 4:
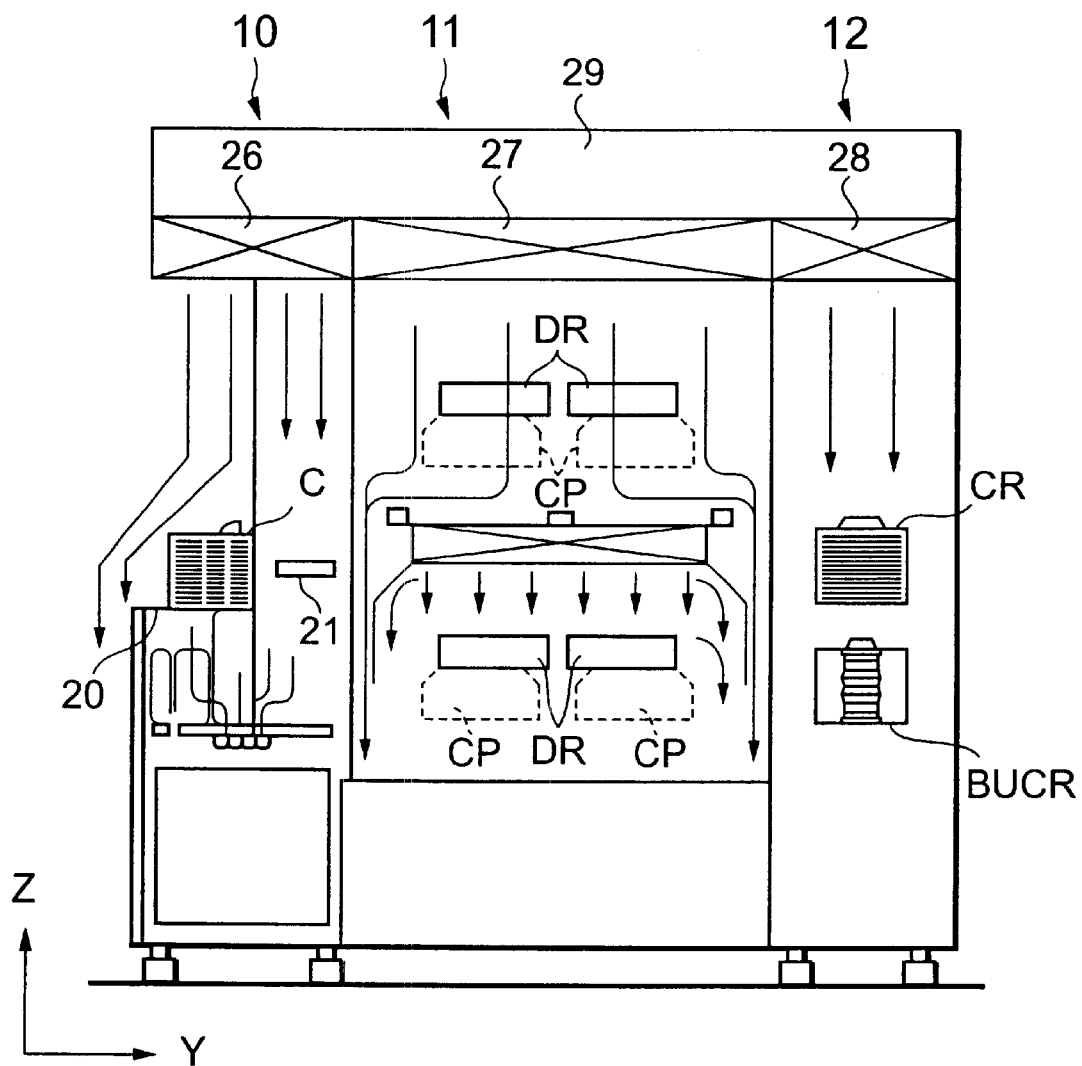
FIG. 4 is a front view showing a flow of air in the resist coating and developing system shown in FIG. 1.

As shown in FIG. 4, a filter 26 is attached to an upper portion of the cassette station 10, a filter 27 is to an upper portion of the processing station 11, and a filter 28 is to an upper portion of the interface section 12, respectively. These filters 26 to 28 jointly have an upper space 29. The upper space 29 communicates with an air conditioner (not shown) in the below via a duct (not shown) so that clean air with ammonia being eliminated and humidity and temperature being controlled is supplied to the upper space 29 from the air conditioner. The clean air is blown downward through each of the filters 26 to 28 from the upper space 29, and thereby down flow of the clean air is formed inside each of the stations and section 10, 11, and 12.

Figure 5:
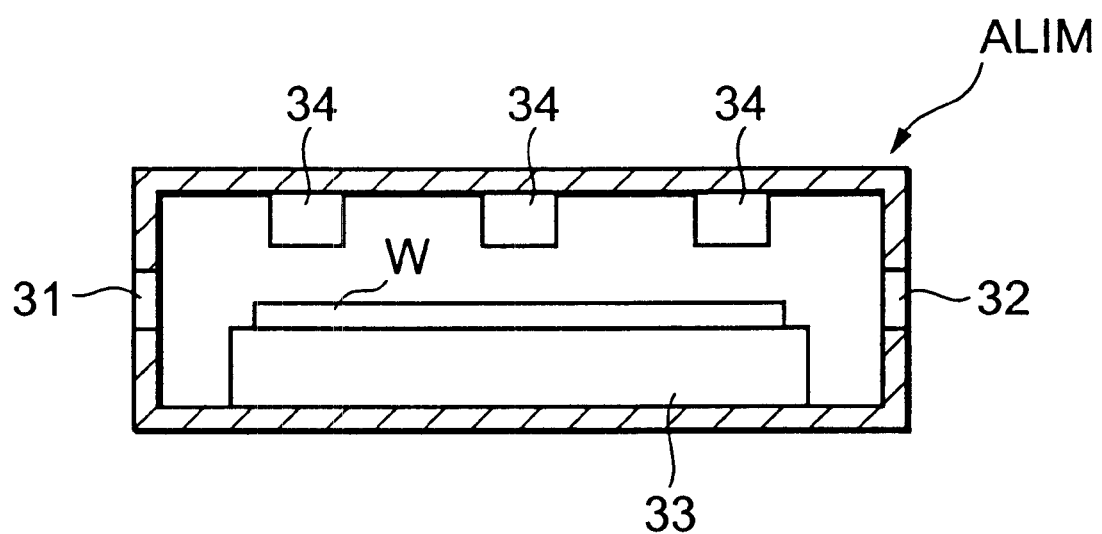
FIG. 5 is a front view showing a schematic configuration of an alignment unit shown in FIG. 3.

FIG. 5 shows the alignment unit (ALIM) of the third processing unit group G3 described above. As shown in FIG. 5, on both sides of this alignment unit (ALIM), provided are an opening 31 for the wafer carrier device 21 of the cassette station 10 to access and an opening 32 for the main carrier device 22 of the processing station 11 to access. A wafer mounting table 33 for positioning the wafer W is disposed in almost the center of the alignment unit (ALIM), and above the wafer mounting table 33, disposed are a plurality of reflected light measuring device 34 for radiating light of the same wavelength as exposure light used in the aforementioned aligner 13 to a base film formed on the wafer W and for measuring the reflected light.

Each of the reflected light measuring devices 34 has the function of measuring the reflected light from each area corresponding to a chip, for example, on the wafer W. Each of the reflective light measuring devices 34 calculates reflectivity, for example, based on the ratio between amounts of the radiation light and the reflected light. A plurality of measuring devices or a single measuring device as above may be disposed.

Figure 6:
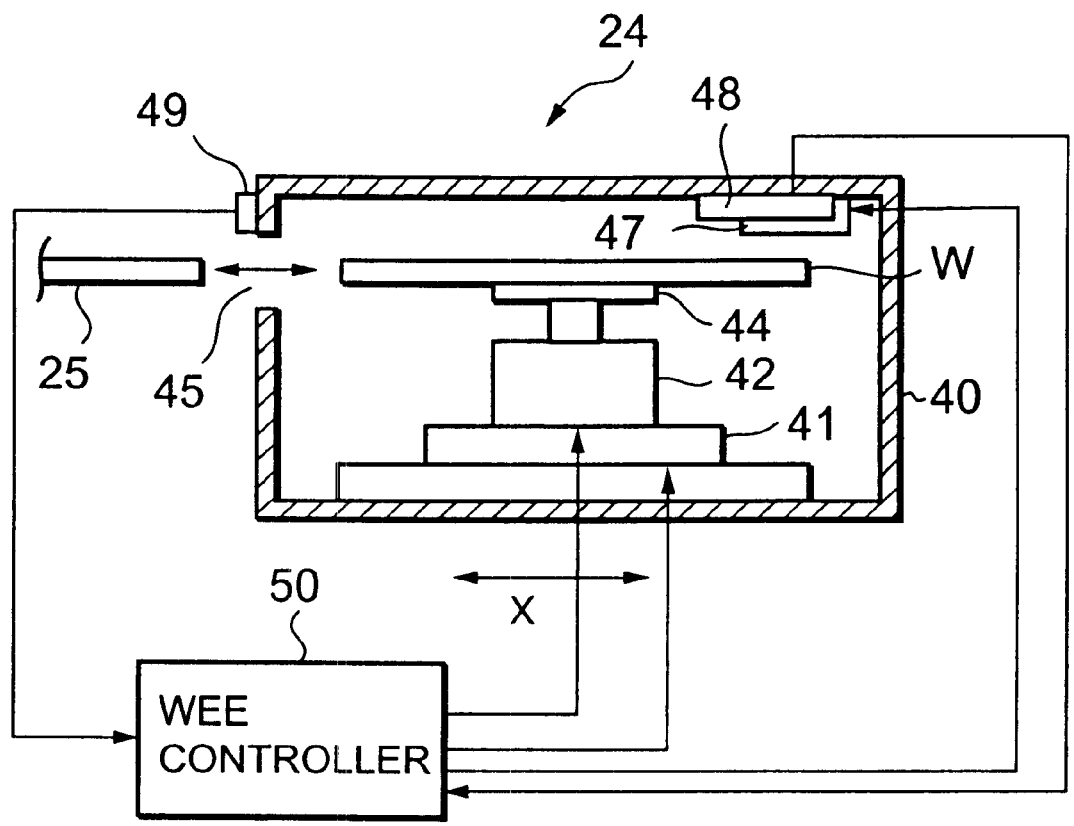
FIG. 6 is a front view showing a schematic configuration of an edge aligner shown in FIG. 1.

FIG. 6 is a diagram for explaining an example of the aforementioned edge aligner 24 (WEE) and a film thickness measuring device provided therein.

As shown in FIG. 6, an X-Y stage 41 is disposed at a bottom portion of a box-shaped body 40 of the edge aligner 24. A rotation mechanism 42 is disposed on the X-Y stage 41. The rotation mechanism 42 holds a spin chuck 44 for rotatably holding the wafer W. The wafer W is suction-held on the spin chuck 44, for example, by a vacuum suction mechanism (not shown). Thus the wafer W is movable in the X-Y direction inside the edge aligner 24, and rotatable in the θ-direction. Further, an opening 45 for transferring the wafer W from and to the wafer carrier device 25 and the spin chuck 44 in the box-shaped body 40 is provided in a front face of the box-shaped body 40 (the face opposing the wafer carrier device 25).

An exposure mechanism 47 for performing preliminary exposure processing for a periphery portion of the wafer W is disposed at a rear portion (the rear side seen from the face opposing the wafer carrier device 25) of a ceiling in the box-shaped body 40. Further, a sensor 48 for detecting the position of the wafer W is disposed adjacently to the exposure mechanism 47. Furthermore, for example, an optical interference type of film thickness measuring device 49 for measuring the film thickness of a resist film formed on the wafer W is disposed above the opening 45 outside the box-shaped body 40.

The results of picking up images by means of the aforementioned sensor 48 is sent to a WEE controller 50. The controller 50 controls the X-Y stage 41, the rotation mechanism 42, the exposure mechanism 47 and the like based on the image pickup results and the like.

Specifically, in the edge aligner 24 structured as above, when the wafer W is received on the spin chuck 44 from the wafer carrier device 25, the X-Y stage 41 is moved and the wafer W is rotated while the sensor 48 detects the position of the outer periphery on the wafer W, thereby adjusting the positions of the outer periphery of the wafer W and the exposure mechanism 47. Positioning is not performed, and the edge position of the outer periphery of the wafer W is detected so that the aligner mechanism 47 and the edge of the wafer W are always in the same position.

Subsequently, while light is radiated to the periphery portion of the wafer W by the exposure mechanism 47, the wafer W is rotated by the rotation mechanism 42, thereby preliminarily exposing an area around the entire outer periphery of the wafer W. The wavelength of the exposure light radiated by the exposure mechanism 47 is set to be the same as the aforementioned aligner 13.

On measurement of the film thickness of a resist film on the wafer W, the wafer carrier device 25 receives the wafer W from the spin chuck 44, and while it carries the wafer w out of the box-shaped body 40 through the opening 45, the film thickness measuring device 49 measures the film thickness of the resist film while scanning over the wafer W in a diameter direction. The wavelength of the light radiated for measuring the film thickness is set to be different from that of the exposure light or multiple wavelengths.

Figure 7:
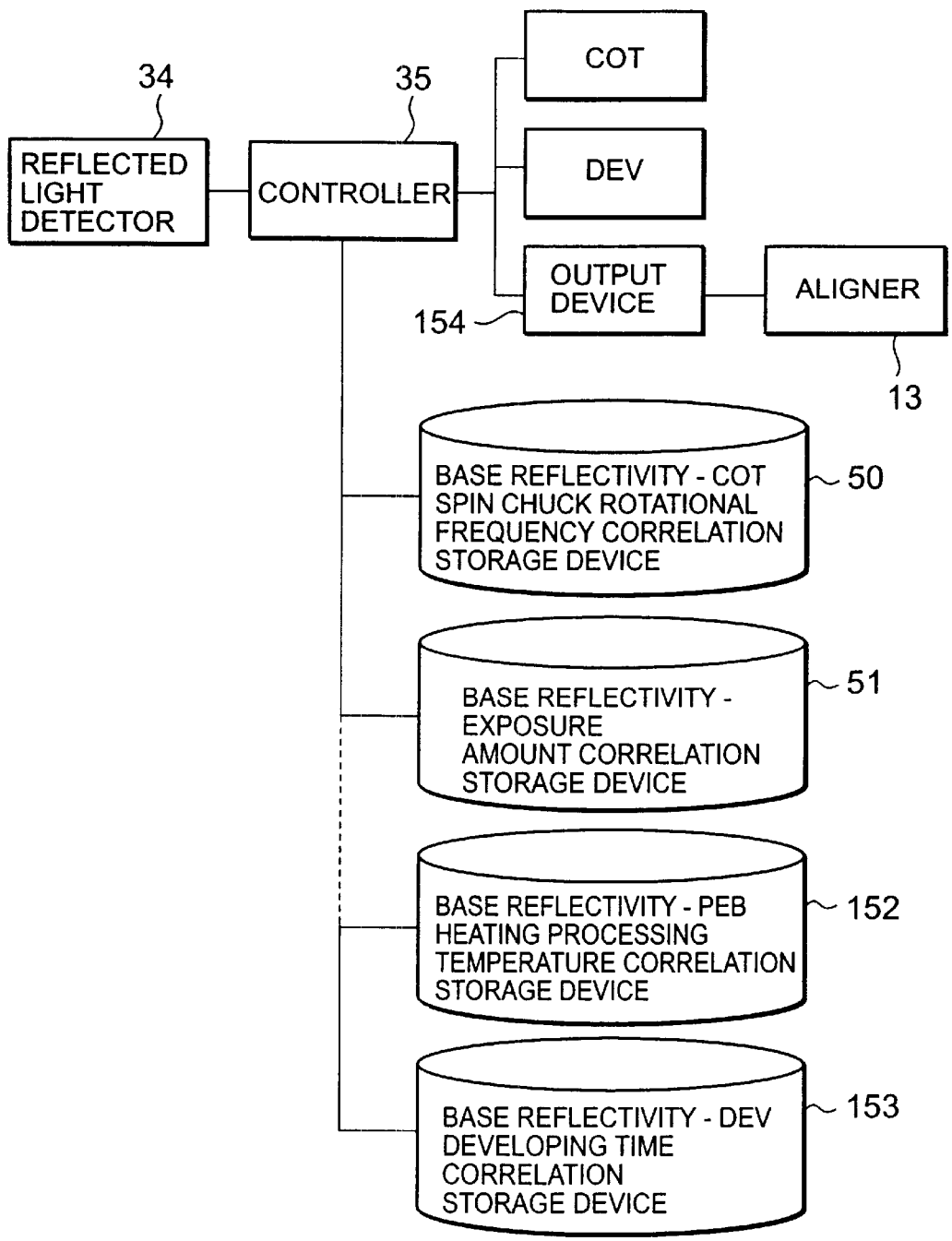
FIG. 7 is a schematic block diagram showing a system configuration.

FIG. 7 is a block diagram showing a configuration of a control system in the resist coating and developing system 1 configured as described above. The configuration and function of the control system together with the operations to the system shown in FIG. 8 will be explained hereinafter.

Figure 8:
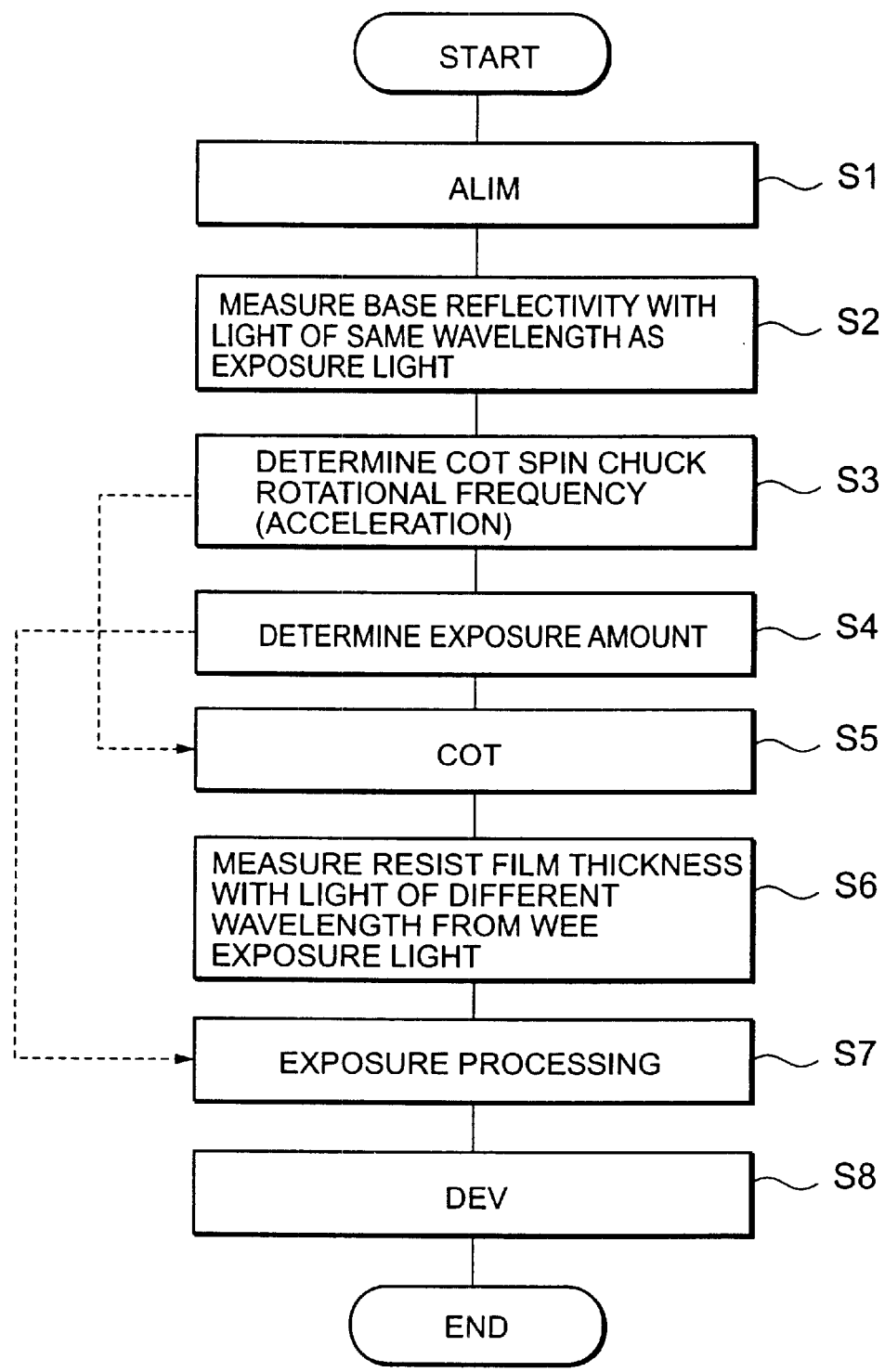
FIG. 8 is a flowchart for explaining an operation of the system.

Initially, the wafer W is guided into the alignment unit (ALIM) of the third processing unit group G of the processing station 11 from the cassette station 10 (step S1 in FIG. 8). Subsequently, the reflectivity of the base film of the wafer W is measured inside the alignment unit (ALIM), and the data is sent to a control unit 35 (step S2).

Figure 9:
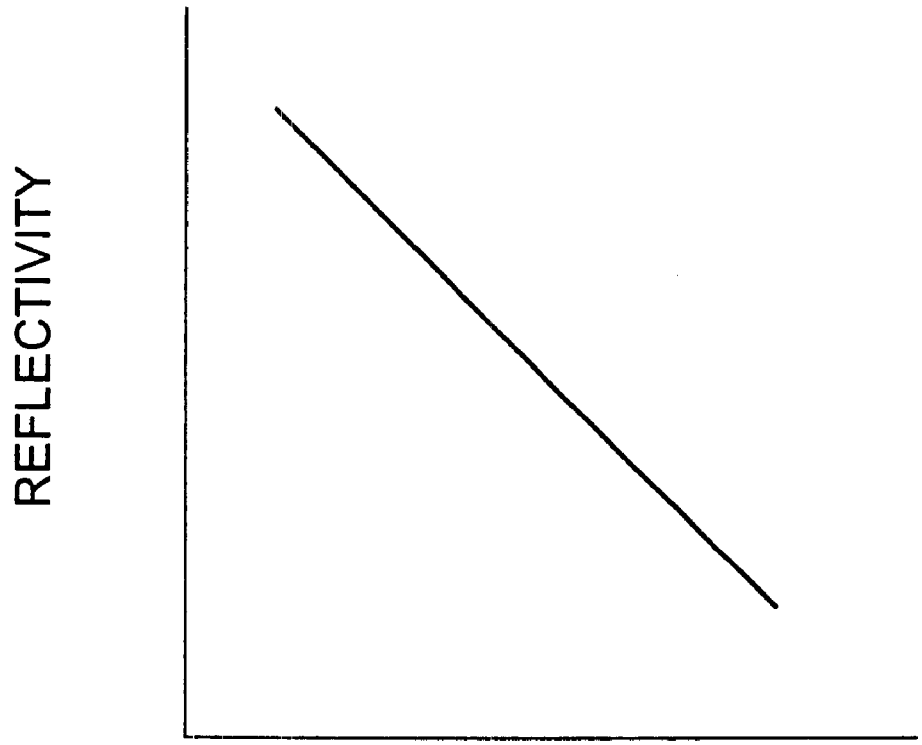
FIG. 9 is a graph showing an example of relation between reflectivity and an optimal resist film thickness.

As shown in FIG. 7, to the control unit 35, connected is a storage device 50 for storing the reflectivity of the base film for obtaining desired line width precision, and the conditions for setting the resist film thickness by the resist solution coating unit (COT), for example, the correlation between the reflectivity and optimum film thickness as shown in FIG. 9 and the correlation between the resist film thickness and spin rotational frequency of he wafer W by the spin chuck in the resist solution coating unit (COT) as shown in FIG. 10. Also to this control unit 35, connected is a storage device 51 for storing the reflectivity of the base film for obtaining desired line width precision, the conditions for setting exposure amount by the aligner 13, for example, the correlation between the reflectivity and the exposure amount (for example, exposure amount per unit area). It may be suitable to make the configuration in which a storage device 150 for storing the reflectivity of the base film for obtaining desired line width precision and the correlation between the reflectivity and the temperature condition for heating processing by the post-exposure baking unit (PEB), and a storage device 151 for storing the reflectivity of the base film for obtaining desired line width precision and the correlation between the reflectivity and the developing processing time by the developing processing unit (DEV) are further connected to the control unit 35.

The control unit 35 gets the reflectivity of the base film formed on the wafer W before the formation of the resist film by COT measured in the aforementioned alignment unit (ALIM), and applies this to the aforementioned correlation storage devices 50 and 51 to thereby calculating the rotational frequency (acceleration) of the spin chuck of the COT and the exposure amount of the aligner 13 for obtaining desired line width precision (steps S3 and S4). Besides the rotational frequency and the exposure amount, heating processing temperature in the aforementioned post-exposure baking unit (PEB) and developing processing time in the developing processing unit (DEV) may be made parameters for obtaining desired line width precision. Further, these parameters may be used individually, or may be used in combination.

Figure 12:
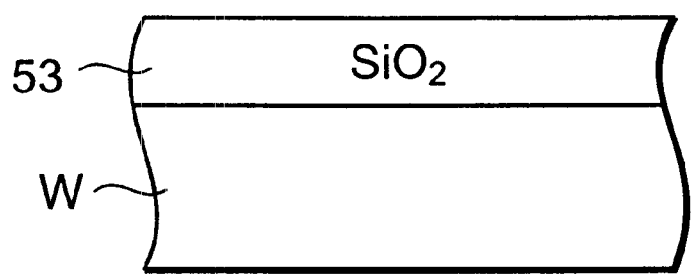
FIG. 12 is a diagram for explaining difference in reflectivity of light on a base film.
Figure 13:
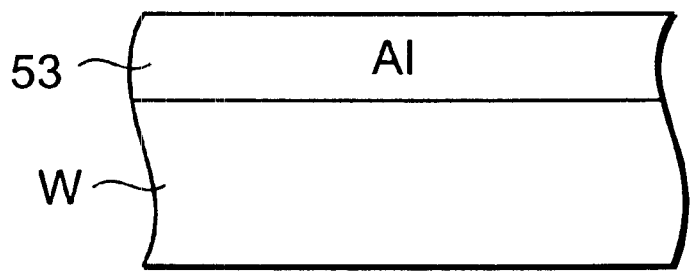
FIG. 13 is a diagram for explaining difference in the reflectivity of light on the base film.

On the wafer W, there exist the area with $SiO_2$ being formed as the base film 53 as shown in FIG. 12, and the area with Al being formed as shown in FIG. 13. The ratio of the area with $SiO_2$ and the area with Al differs according to the circuit patterns to be formed, and the reflectivity of light on the base film 53 differs according to the ratio. After the reflectivity is measured, the wafer W is carried out of the alignment unit (ALIM) to be transferred.

Subsequently, the wafer W is subjected to hydrophobic processing in the adhesion processing unit (AD) of the third processing unit group G3, and after cooled in the cooling processing unit (COL) of the third processing unit group G3 or the fourth processing unit group G4, the wafer W is coated with a photoresist film formed thereon in the resist solution coating unit (COT) of the first processing unit G1 or the second processing unit G2 (step S5). At this time, the control unit 35 controls the rotational frequency of the wafer W during spin-dry in the resist solution coating unit (COT) with the condition corresponding to the data of the reflectivity measured by the reflected light measuring device 34. It may be suitable to control the heating processing time in the post-exposure baking unit (PEB) and the developing processing time in the developing processing unit (DEV) as in the above.

After the photoresist film is formed, heat processing is performed in the prebaking unit (PREBAKE) of the third processing unit group G3 or the fourth processing unit group G4, thereby eliminating a residual solvent by evaporation from the photoresist film on the wafer W. Next, the wafer W is cooled in the extension cooling unit (EXTCOL) in the fourth processing unit group G4, and thereafter it is placed inside the extension unit (EXT) of the fourth processing unit group G4. Subsequently, the wafer carrier device 25 is carried therein from the opposite side to thereby carry out the wafer W.

The wafer W after being carried out is subjected to edge exposure processing on the wafer periphery portion of, for example, the width of 2 mm by the edge aligner 24 (WEE).

In the edge aligner, the wafer W is placed on the spin chuck 44 via the wafer carrier device 25, and while the sensor 48 detects the position of the wafer W, positioning of the wafer W is carried out by the X-Y stage 41 and the rotation mechanism 42, thereby performing edge exposure for the wafer W. Subsequently, the wafer carrier device 25 receives the wafer W from the spin chuck 44, and while it carries the wafer W to the outside of the box-shaped body 40 via the opening 45, the film thickness measuring device 49 measures the film thickness on the wafer W (step S6).

The wafer W after the edge exposure is housed in a buffer cassette (BUCR) in order by the wafer carrier device 25. Thereafter, when a receiving signal is transmitted from the aligner 13, the wafer housed in the buffer cassette (BUCR) is transferred to the aligner in order by the wafer carrier device 25, and is subjected to exposure processing in order (step S7).

At this time, the controller 35 outputs an ID of. the wafer W and the condition for setting the exposure amount by the aligner 13 obtained in the above processing, which corresponds to the ID, for example, the data regarding the exposure amount (for example, the exposure amount per unit area) to the aligner 13 via an output unit 154. Thus, exposure processing based on the data is performed in the aligner 13. The controller 35 outputs the ID of the wafer W, positional information of each chip of the wafer W, and the condition for setting the exposure amount by the aligner 13 obtained in the above processing, which corresponds to the positional information, for example, the data (specifically, data per chip) regarding the exposure amount (for example, the exposure amount per unit area). Thus, in the aligner 13, it becomes possible to perform exposure processing with the exposure amount being controlled for each chip based on the data.

When the exposure by the aligner is finished, the exposed wafer W is transferred to the main carrier device 22 via the fourth processing unit group G4 contrary to the above, and is transferred to the post-exposure baking unit (PEB) by the main carrier device 22, whereby the aforesaid wafer W is subjected to heat processing and thereafter subjected to cool processing at a predetermined temperature in the cooling unit (COL).

Next, the wafer W is transferred to the main carrier device 22, and carried into the developing processing unit (DEV) of the first processing unit group G1 or the second processing unit group G2, and after it is developed with a developing solution, the developing solution is rinsed with a rinse solution, thus completing the developing processing.

Subsequently, the wafer W is carried out of the developing processing unit (DEV) by the main carrier device 22. Thereafter, the wafer W is subjected to heat processing in the post-baking unit (POBAKE) of the third processing unit group G3 or the fourth processing unit group G4, and after cooled in the cooling processing unit (COL) of the third processing unit group G3 or the fourth processing unit group G4, it is placed in the extension unit (EXT) of the third processing unit group G3. The wafer carrier device 21 is carried therein from the opposite side and carries out the wafer W to carry the wafer W into the cassette C for housing the processes wafer, which is placed on the cassette station 10.

According to the embodiment, the reflected light measurement device 34 detects the reflectivity of the light on the base film of the wafer W prior to the formation of the resist pattern, and based on the detected reflectivity, the rotational frequency during spin-dry of the wafer W in the resist solution coating unit (COT) and the exposure amount in the aligner 13 are controlled, thus making it possible to control the line width of the resist pattern with high precision. Consequently, according to the present embodiment, the assessment of resist line width can be conducted without measuring the resist line width with use of the SEM.

Further, according to the embodiment, the reflectivity is measured with use of light of the same wavelength as the exposure light, thus making it possible to accurately detect influence exerted by the base film during exposure processing. Though the light of the same wavelength as the exposure light is used, it is used before resist coating, and therefore it does not have an adverse effect on the line width of the resist pattern.

Meanwhile, in this embodiment, film thickness measurement after the resist film measurement is performed by using the light of a different wavelength from the exposure light. Thus, an adverse effect is not given to the line width of the resist pattern.

It should be noted that the present invention is not limited to the aforementioned embodiment, and various modifications may be made within its technical concept.

Figure 14:
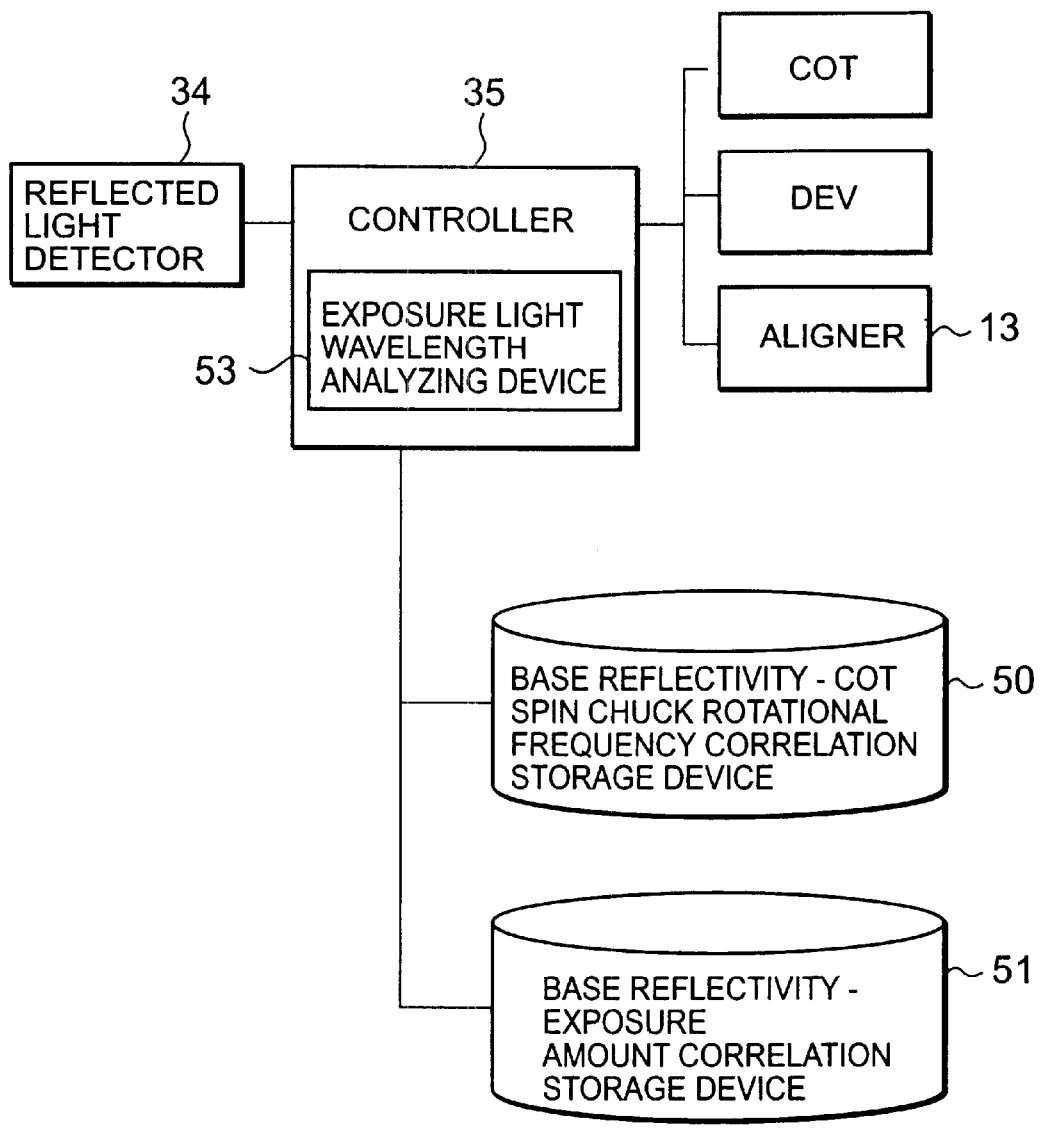
FIG. 14 is a schematic block diagram showing a system configuration of a second embodiment.

FIG. 14 is a schematic block diagram showing a second embodiment. The same components as in the aforementioned one embodiment are given the identical numerals and symbols and the explanation thereof will be omitted.

In the aforementioned one embodiment, the reflectivity of the base is measured with use of the light of the same wavelength as the exposure light, but in the second embodiment, measurement is performed with use of light of multiple wavelengths.

Thus, an apparatus in this embodiment has an exposure light wavelength analyzer 53 for taking out a component of the same wavelength as the exposure light from the reflected light obtained from the aforementioned reflected light measuring device 34 and detecting the reflectivity thereof. By performing the same processing as in the above described one embodiment with use of the reflectivity obtained by the exposure light wavelength analyzer 53, the rotational frequency of the spin chuck, exposure amount, and the like are controlled.

According to the above configuration, light of multiple wavelengths is used, thus obtaining the effects of easily corresponding to the case in which the wavelength of the exposure light changes.

Figure 15:
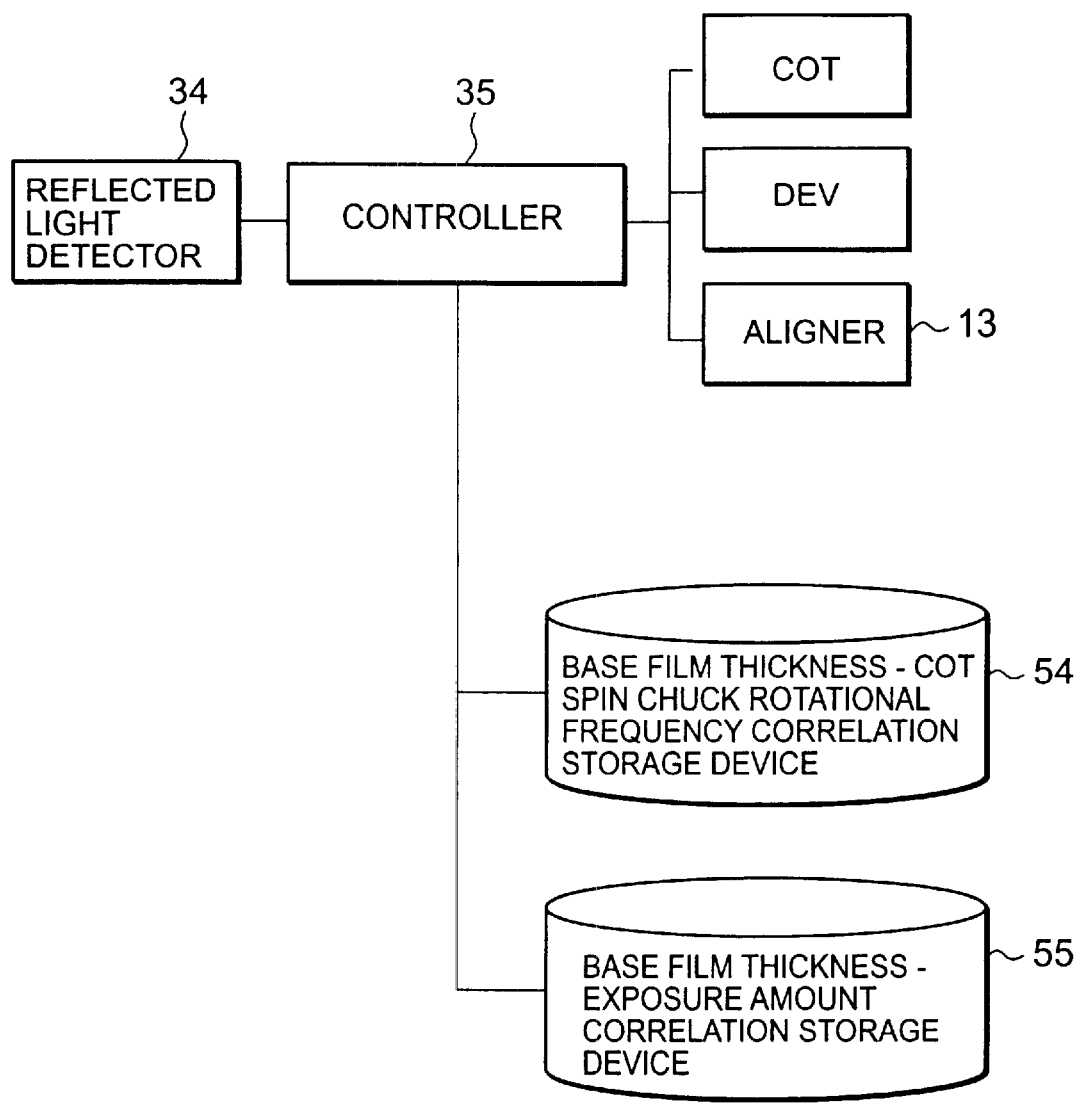
FIG. 15 is a schematic block diagram showing a system configuration of a third embodiment.

FIG. 15 is a schematic block diagram showing a third embodiment.

In the aforementioned one embodiment, the condition for coating the resist solution or the condition for exposure processing is controlled based on the reflectivity of the base film, but in the third embodiment, these conditions are controlled based on the film thickness of the base film.

Thus, in this embodiment, an interference type of film thickness measuring device is used as the aforementioned reflected light measuring device 34. The film thickness measuring device radiates light of the same wavelength as the exposure light to the base film, and detects the film thickness of the base film from the difference in phase of the reflected light. Further, to the aforementioned control unit 35, connected are a base film thickness–COT spin chuck rotational frequency correlation storage device 54 and a base film thickness–exposure amount correlation storage device 55.

The control unit 35 calculates the spin chuck rotational frequency and the exposure amount from the correlation stored in the storage devices 54 and 55, and sets them at the aforementioned resist solution coating unit (COT), the aligner 13 and so on.

According to the above configuration, the effect of favorably controlling the line width of the resist pattern based on the film thickness of the base film is provided.

Meanwhile, in the above described one embodiment, the rotational frequency of the spin chuck during spin-dry is controlled as the condition for forming the resist film, but this is not restrictive. It may be suitable to control the rotational frequency or acceleration of the spin chuck during coating, for example.

Further, in the above described one embodiment, the exposure amount is controlled as the condition for exposure, but this not restrictive. It may be suitable to control exposure time, for example.

Furthermore, the aforementioned reflected light measuring device 34 is provided in the alignment unit, but this not restrictive. The reflected light measuring device 34 may be provided at any place on the wafer W carrier path in the resist coating and developing system 1, or may be separately provided outside the resist coating and developing system 1.

Further, for example, the substrate is not limited to the above described wafer W, and an LCD substrate, a glass substrate, a CD substrate, a photo mask, a print substrate, a ceramic substrate and the like are applicable.

As explained above, according to the resist processing method and the resist processing apparatus of the present invention, it becomes possible to control the line width of the resist pattern with a high degree of precision.

As explained in the above described embodiment, the resist solution is applied onto the wafer by a spin-coating method in this system, but in such a spin-coating method, the higher the rotational frequency of the wafer, the larger the centrifugal force, thus decreasing the film thickness, and as the result, the line width varies. In concrete, the film thickness is dependent on the rotational frequency of a motor of the spin chuck, but is further varied in accordance with the temperature and humidity of atmosphere. Consequently, a resist film is conventionally formed with use of a test wafer, for example, once in a few days, the target value of the rotational frequency of the motor by which the optimum film thickness can be obtained is determined. This is inputted and set in the unit, and a control is performed so that the temperature and humidity of atmosphere are constant in the mass production process. In this case, desired film thickness cannot be directly inputted in the unit, and it is necessary for an operator to convert this into the rotational frequency of the motor and input and set this. However, according to such a method, not only the conversion is troublesome, but also accurate rotational frequency sometimes cannot be inputted since it is calculated by an operator. When inaccurate rotational frequency is set, the film thickness is out of a preset value during mass production, and depending on the extent, the line has to be stopped and the test has to be redone. In such a case, not only stable processing cannot be performed, but also testing frequency is high, which becomes a cause of reduction in throughput. Thus, a system according to the following embodiment is capable of easily and accurately making the setting for obtaining desired film thickness regarding the coating film, and its object is to control the line width of a resist pattern with precision, for example, in a photolithography process. Hereinafter, the embodiment will be explained.

A coating and developing system according to this embodiment has an inline film thickness measuring device for detecting the film thickness of a coating film formed on the wafer W for deriving the conditions, for example, inside the edge aligner (WEE) in the coating and developing processing system shown in FIG. 1 to FIG. 4.

Figure 16:
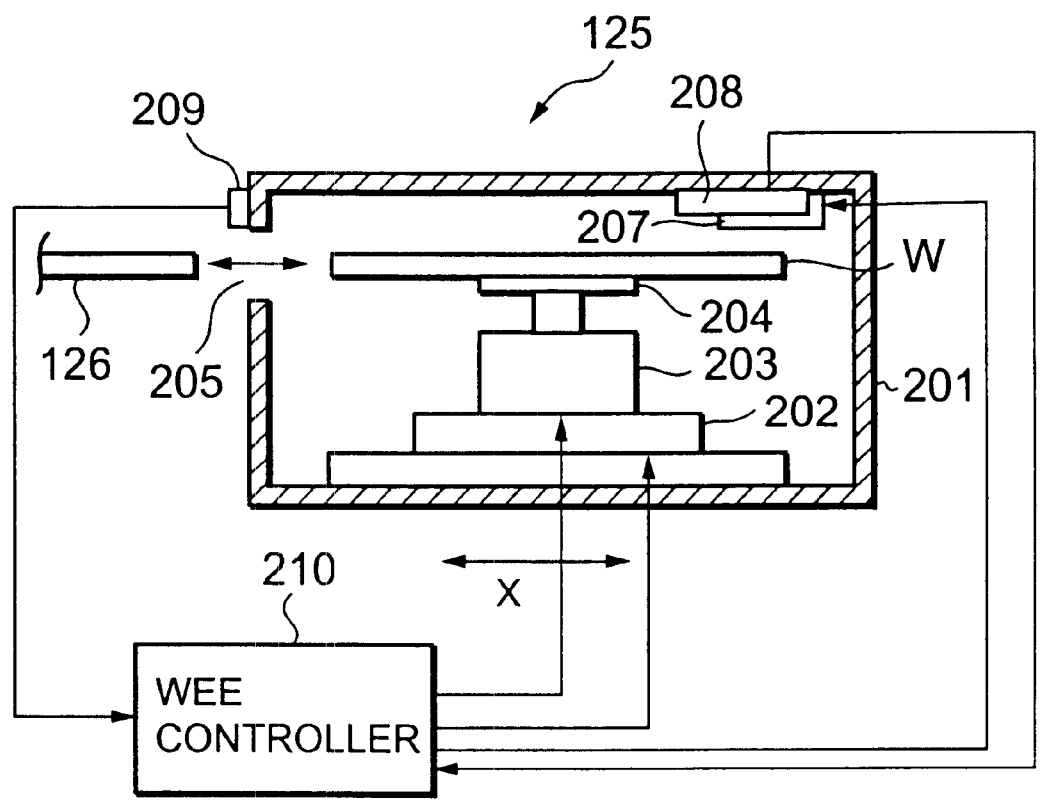
FIG. 16 is a front view of an edge aligner according to still another embodiment of the present invention.
Figure 17:
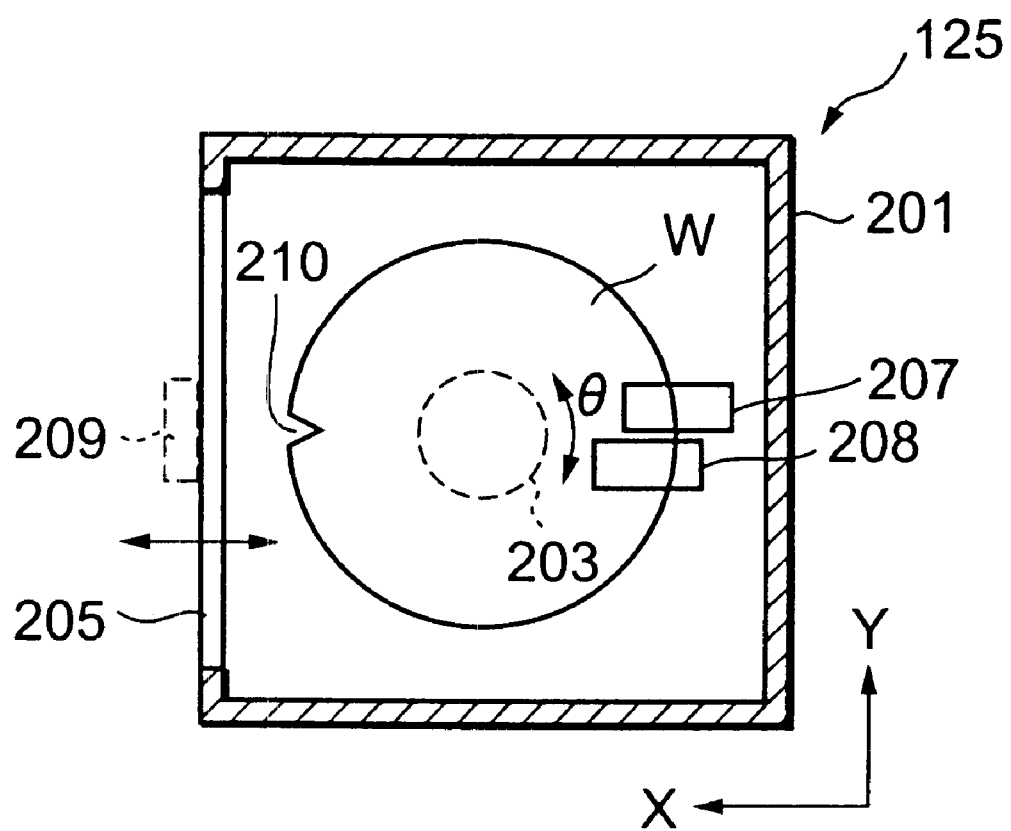
FIG. 17 is a plan view of the edge aligner in FIG. 16.

FIG. 16 and FIG. 17 are a side view and plan view for explaining an edge aligner 125 (WEE) according to the embodiment and an example of a film thickness measuring device provided therein.

As shown in FIG. 16 and FIG. 17, an X-Y stage 202 is disposed at a bottom portion of a box-shaped body 201 of the edge aligner 125. A rotation mechanism 203 is disposed on the X-Y stage 202. The rotation mechanism 203 rotatably holds a spin chuck 204 for holding the wafer W. The wafer W is suction-held on the spin chuck 204, for example, by a vacuum suction mechanism (not shown), whereby the wafer W is movable in an X-Y direction and rotatable in a θ-direction inside the edge aligner 125.

At a front face of the box-shaped body 201 (the face opposing a wafer carrier body 126), provided is an opening 205 through which the wafer W is transferred from and to a wafer carrier body 126 and the spin chuck 204 inside the box-shaped body 201. The width of the opening 205 is larger than the wafer W, and the height of the opening 205 is larger than the height of the wafer carrier body 126 with the wafer W placed thereon.

An exposure mechanism 207 for performing preliminary exposure processing for the periphery portion of the wafer W is disposed at a rear portion (the rear side seen from the face opposing the wafer carrier body 126) of a ceiling inside the box-shaped body 201. Further, a sensor 208 for detecting the position of the wafer W is disposed adjacently to the exposure mechanism 207. Furthermore, for example, an optical interference type of film thickness measuring device 209 for measuring the film thickness of a resist film on the wafer w is disposed on the opening 205 outside the box-shaped body 201.

The image pickup result by the sensor 208 and the film thickness measuring result of the film thickness measuring device 209 are sent to a WEE controller 210. The controller 210 controls the X-Y stage 202, the rotation mechanism 203, the exposure mechanism 207 and the like based on the image pickup result and the like.

In the edge aligner 125 configured as above, when the wafer W is received on the spin chuck 204 from the wafer carrier body 126, the X-Y stage 202 is moved and the wafer W is rotated while the sensor 208 is detecting the position of the outer periphery of the wafer W, thereby adjusting the positions of the outer periphery of the wafer W and the exposure mechanism 207. Instead of conducting positioning, the position (the edge portion of the outer periphery of the wafer W) is detected so that the exposure mechanism 207 is always in the same position as the edge of the wafer W. Subsequently, the wafer W is rotated by the rotation mechanism 203 while light is radiated to the periphery portion of the wafer W by the exposure mechanism 207, thus preliminarily exposing the area in the vicinity of the entire outer periphery of the wafer W.

Further, on measuring the film thickness of the resist film on the wafer W, the wafer carrier body 126 receives the wafer W from the spin chuck 204 after positioning is completed as described above, and the film thickness measuring device 209 measures the film thickness on the wafer W while the wafer carrier body 126 carried out the wafer W to the outside of the box-shaped body 201 via the opening 205.

Figure 18:
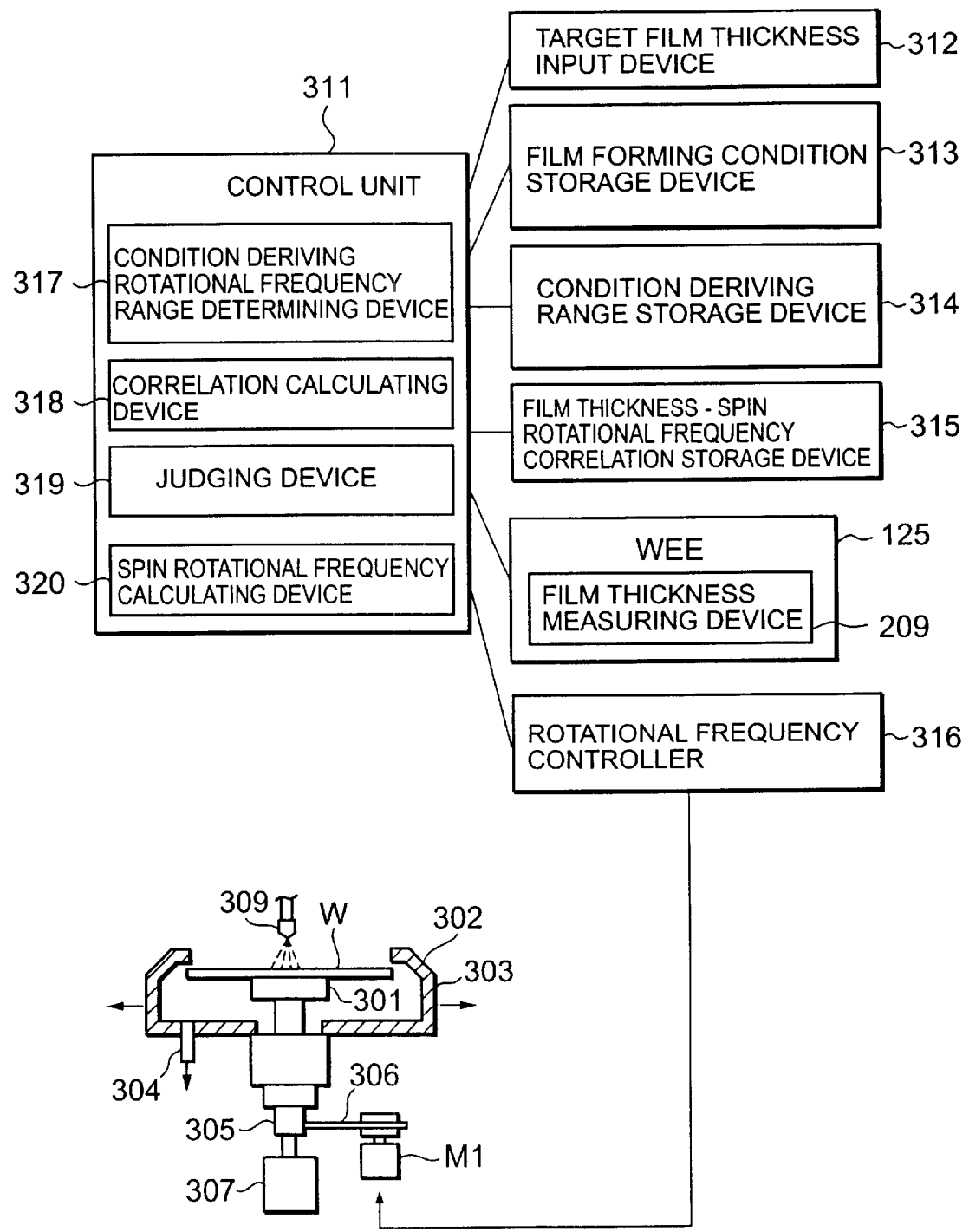
FIG. 18 is a schematic block diagram showing an embodiment of a control system according to a coating film forming unit and the present invention.

Next, the resist coating unit (COT) for forming the aforementioned resist film and the configuration of the control system according to the present invention will be explained with reference to FIG. 18.

Initially, the processing unit will be explained. In FIG. 18, numeral 301 denotes a spin chuck being a substrate holding device, and is structured to horizontally hold the wafer W by vacuum-suction. Around the spin chuck 301, provided is a fixed cup 302 so as to surround it. An exhaust port 303 and a drainage port 304 are formed in a side face and a bottom face of the fixed cup 302 respectively. A top opening of the fixed cup 302 is opened when a resist solution is applied.

The spin chuck 301 is provided at a top portion of a driving shaft 305 which is the combination of a rotation shaft and an ascending and descending shaft, and the driving shaft 305 is structured to be able to rotate by a motor M1 via a transmission mechanism 306 including a pulley and a belt and descend and ascend by an ascending and descending mechanism 307.

Above the fixed cup 302, provided is a resist solution nozzle 309 for supplying a resist solution by dropping it to a center portion of the wafer W held by the spin chuck 301, and the nozzle 309 is structured to be able to move above the area between the center portion of the wafer W and the outside from the side portions of the fixed cup 302 by an arm not shown. Further, the resist solution nozzle 309 is connected to a resist solution tank not shown via a resist solution supply pipe not shown, and a predetermined amount of resist solution is discharged by pressurizing, for example, the inside of the resist solution tank.

Next, the detection and control system will be explained. Describing only the configuration related to the concept of the present invention, to a control unit 311 (a rotation speed setting unit) shown in FIG. 18, connected are a film thickness inputting device 312 for inputting the target film thickness of a resist film, a film forming condition storage device 313 for storing the film forming condition of a resist solution, a condition deriving range storage device 314 for storing the range of spin rotational frequency from which a condition is derived, a film thickness–spin rotational frequency correlation storage device 315, the film thickness measuring device 209 provided in the aforementioned edge aligner 125 (WEE), and a rotational frequency controller 316 for controlling the aforementioned motor M1.

Further, the control unit 311 has a condition deriving rotational frequency range determining device 317, a correlation calculating device 318 for calculating the film thickness–spin rotational frequency correlation, a judging device 319 for judging the aforementioned target film thickness exists within the range of the aforementioned correlation and having the condition deriving process executed once again when it does not exists within the aforementioned correlation, and a spin rotational frequency calculating device 320 for calculating the spin rotational frequency by which the target film thickness can be obtained based on the correlation.

Hereinafter, these configurations are explained in detail based on the functions.

The film forming conditions stored in the aforementioned film forming condition storage device 313 at least contain target film thickness M0 of the coating film, and rotational frequency K0 of the spin chuck 301 while the resist solution is spread.

The aforementioned condition deriving range storage device 314 stores a table for determining the spin rotational frequency range for deriving the condition of a comparative narrow range according to the target film thickness M0 inputted and set, for example, through the aforementioned film thickness input device 312 (the film thickness setting device). The table specifies the range of the spin rotational frequency by which predetermined target film thickness M0 can be obtained based on an empirical value. The range of the spin rotational frequency is set to be a narrow range, for example, of the width of about 10 rpm. If it is set to be a wide range, it takes much time to derive the condition.

Figure 19:
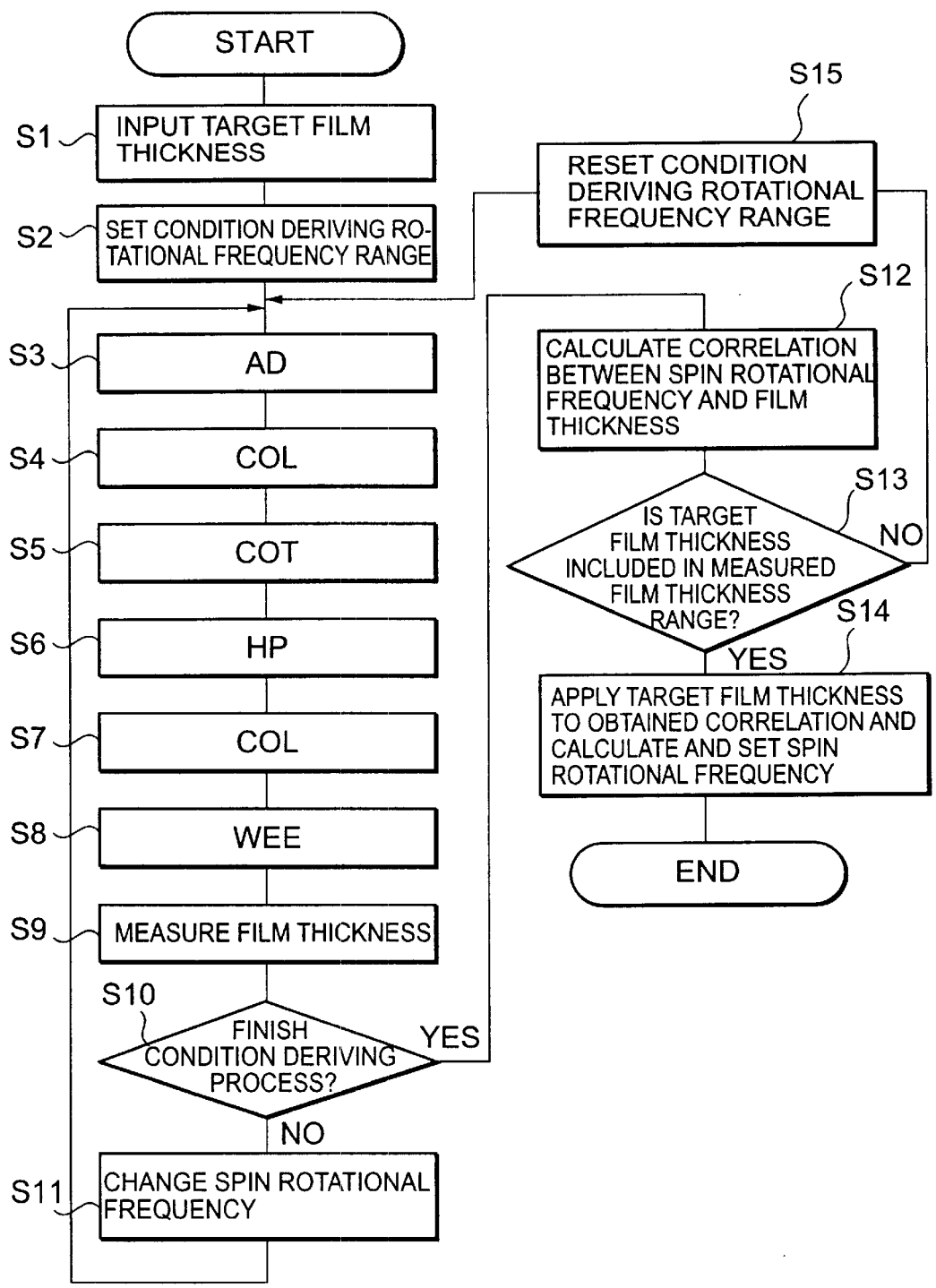
FIG. 19 is a flowchart showing a condition deriving process.

The spin rotational frequency–film thickness correlation storage device 315 stores the spin rotational frequency–film thickness correlation obtained as a result of deriving the condition from the aforementioned spin rotational frequency range. That is to say, the correlation is calculated by using the wafer W for deriving the condition. Thus, a condition deriving process for the condition deriving wafer will be explained with reference to FIG. 19.

Initially, the aforementioned operator inputs the desired target film thickness M0 via the aforementioned film thickness input device 312 (step S1). The aforementioned condition deriving range determining device sets the spin rotational frequencies at the upper limit and the lower limit of the condition deriving range and several rotational frequencies between them in accordance with the inputted target film thickness as the spin rotational frequency for deriving the condition (step S2).

Subsequently, by preparing as many wafers as the number of the above rotational frequencies and repeating steps S3 to S9, film thickness data corresponding to the rotational frequencies are obtained.

Explaining the steps S3 to S4, hydrophobic processing is performed for the wafer W by the adhesion processing unit (AD) at first (step S3). Thereafter, the wafer W after the hydrophobic processing is subjected to cooling processing by the cooling processing unit (COL) (step S4). Subsequently, the wafer W is inserted into the resist coating unit (COT), and then the wafer W after the aforementioned cooling processing is coated with the resist solution (step S5).

Next, the wafer W with the resist being formed is heat-processed by the baking unit (POBAKE) (step S6), and thereafter cooling processing is performed for the heat-processed wafer W by the cooling processing unit (COL) (step S7).

Subsequently, the wafer W is placed on the spin chuck 204 inside the edge aligner 125 via the wafer carrier body 126, and while the position of the wafer W is detected by the sensor 208, positioning of the wafer W is performed by the X-Y stage 202 and the rotation mechanism 203, and edge exposure is performed for the wafer W (step S8). The wafer carrier body 126 receives the wafer W from the spin chuck 204, and while it carries out the wafer W to the outside of the box-shaped body 201 via the opening 205, the film thickness measuring device 209 measures the film thickness on the wafer W (step S9).

Next, in step S10, it is determined whether the condition deriving process is finished. In concrete, it is determined whether the film thickness measurement is finished for all the rotational frequencies set in the aforementioned condition deriving rotational frequency range. When it is not finished, the spin rotational frequency is changed in step S11, and steps S3 to S9 are executed once again. When the condition deriving process is finished, the correlation between the spin rotational frequency and the film thickness is calculated in step S12 based on the above described film thickness measuring result.

Figure 20:
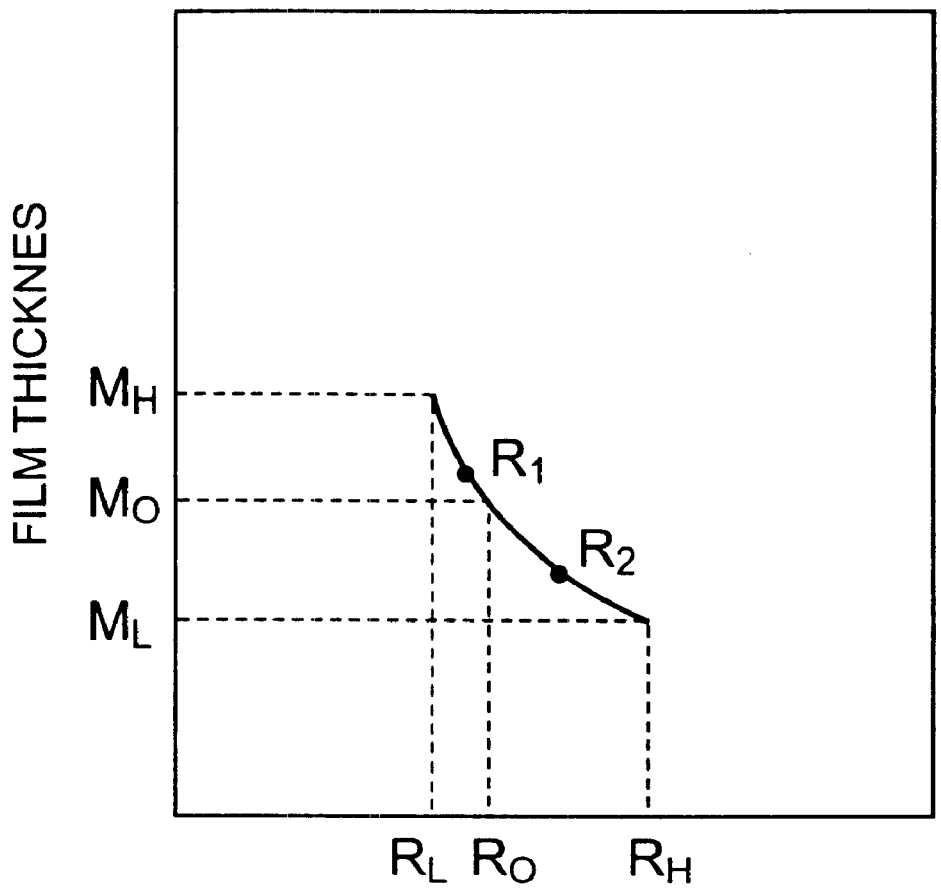
FIG. 20 is a diagram for explaining calculation of correlation between film thickness and spin rotational frequency.
Figure 21:
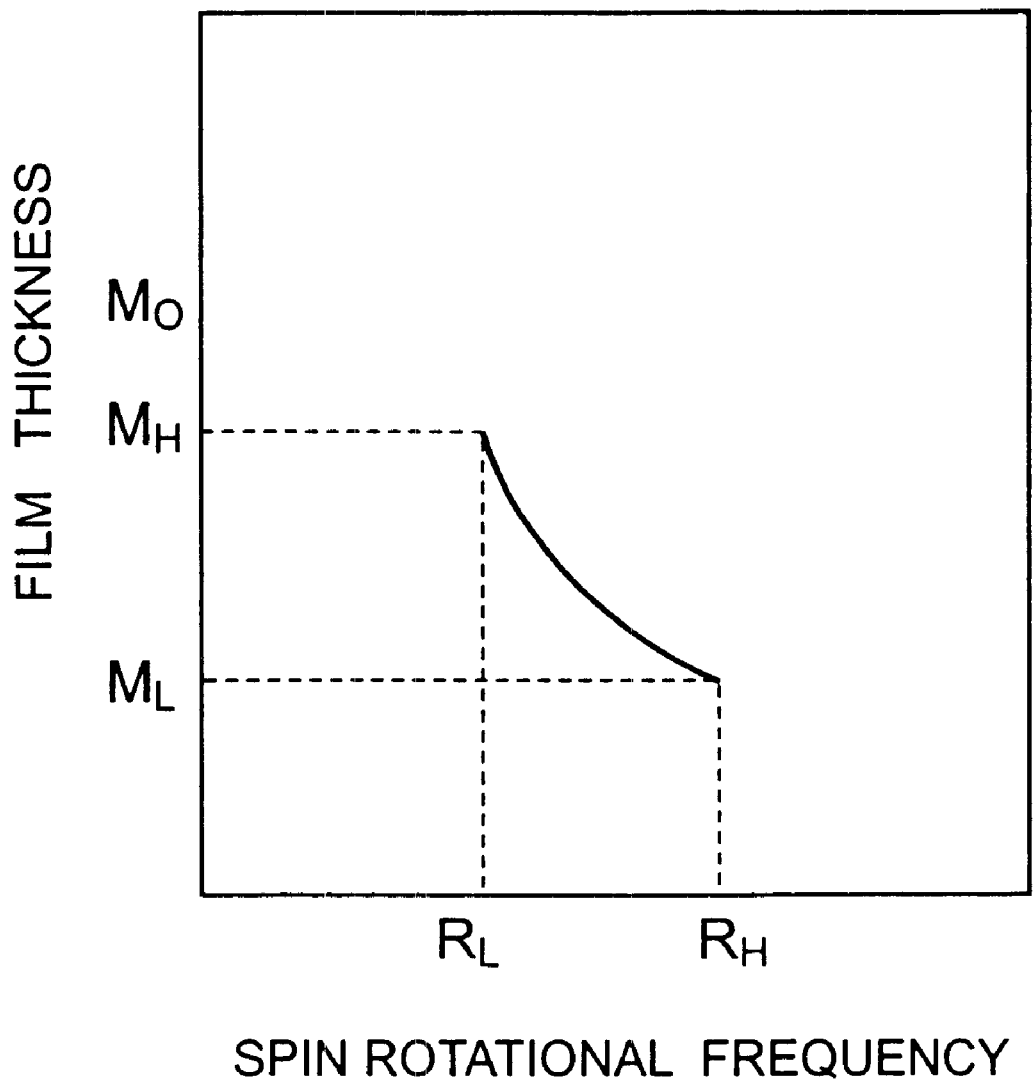
FIG. 21 is a diagram for explaining calculation of the correlation between the film thickness and the spin rotational frequency.
Figure 22:
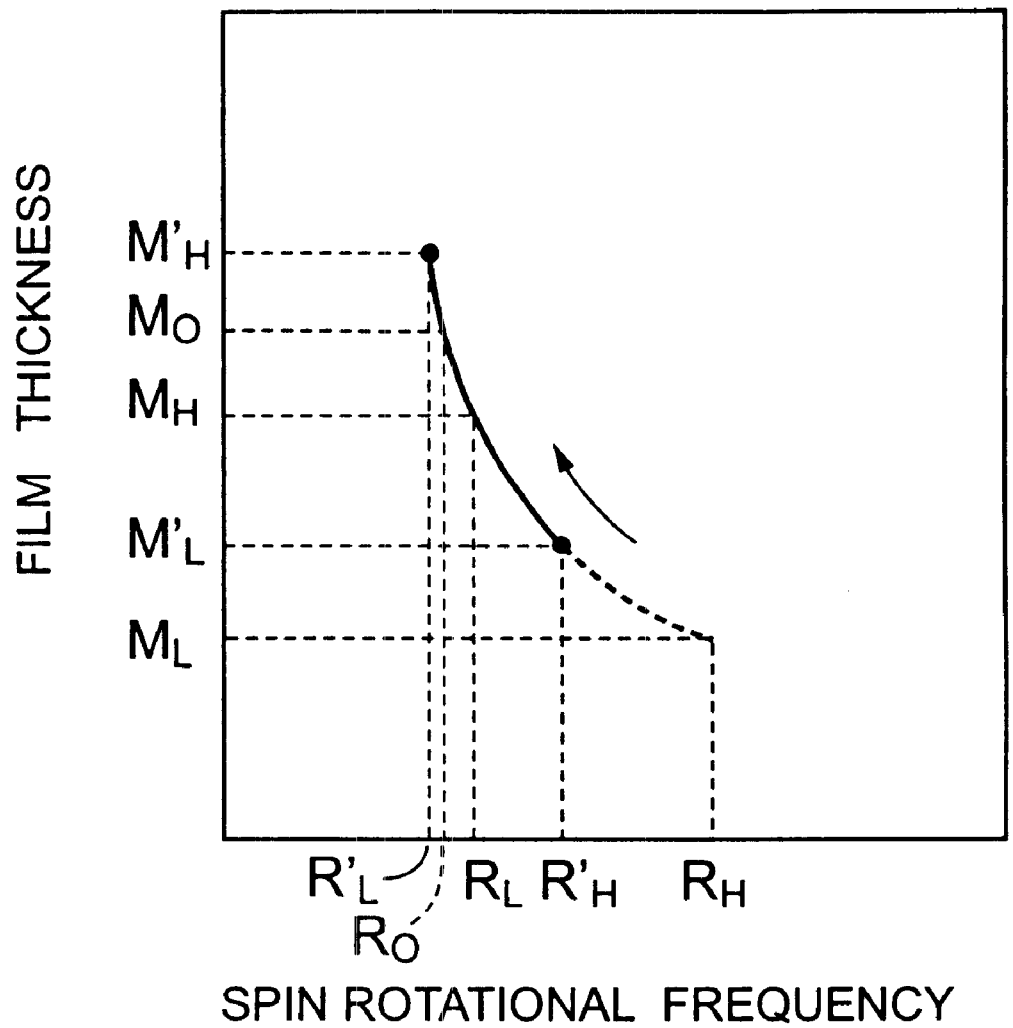
FIG. 22 is a diagram for explaining calculation of the correlation between the film thickness and the spin rotational frequency.

The process will be specifically explained with use of FIG. 20 to FIG. 22.

In the aforementioned step S2, it is assumed that the spin rotational frequency range for deriving the condition, which is set according to the target film thickness M0 is RL (lower limit) to RH (upper limit). In this case, for example, four condition deriving rotational frequencies including, for example, two rotational frequencies (R1, R2) between the upper and lower limit are set, and steps S3 to S9 are executed for each rotational frequency, and the film thickness on each occasion is measured.

Based on the result, the curved line showing the correlation shown by the solid line in the diagram is obtained. In concrete, in such a narrow range as the condition deriving rotational frequency range in this embodiment, the above described correlation is obtained with the measured data regarded as suitable to be approximated to a quadratic curve. In this example, the upper limit rotational frequency obtained in the aforementioned condition deriving rotational frequency range is MH and the lower limit rotational frequency is ML. Such correlation is stored in the aforementioned correlation storage device 315.

Next, in step S13, it is determined whether the target film thickness M0 is included in the aforementioned measured film thickness range. At this time, as shown in FIG. 20, when the M0 exists between the above described MH and ML, it is determined as "contained", and in step S14, as shown in FIG. 20, a rotational frequency R0 corresponding to the above described M0 is obtained, and this is set as the spin rotational frequency by which the film thickness M0 can be obtained.

Meanwhile, as shown in FIG. 21, when the M0 does not exist between the above described MH and ML, the condition deriving rotational frequency range in which the aforementioned M0 is estimated to exist is set again in step S15, and steps S3 to S11 are executed once again.

In FIG. 22, the condition deriving rotational frequency range is shifted from the aforementioned "RL to RH" to "RL' to RH'"", and the correlation is obtained in step S12. It is preferable that the shift amount of the condition deriving range is calculated based on the difference between the aforementioned MH or ML and the aforementioned M0, but it may be suitable to shift it by a predetermined amount upward or downward. When it is determined that the aforementioned M0 is included in the rotational frequency range MH' to ML' obtained as the result of a second measurement (step S13), the R0 obtained from this correlation is set as the spin rotational frequency (step S14).

According to the configuration explained above, the effect that proper spin rotational frequency can be set by inputting the target film thickness is obtained.

In other words, conventionally in this type of apparatus, operators cannot directly input the film thickness into the apparatus though it is the film thickness of the resist film that they want to set with high precision, and the operators need to convert it into the other condition such as rotational frequency and the like to set it. However, according to the above described configuration, it is possible to set the rotational frequency of the spin chuck by inputting and setting desired resist film thickness.

Further, in the present invention, in view of the fact that the rotational frequency during spin-rotation has the greatest effect on the formation of the film thickness rather than the rotational frequency during spreading of the resist, the spin rotational frequency is set according to the film thickness of the aforementioned resist film. Thus, the film thickness can be accurately controlled, and as the result, the effect that the line width of a resist pattern can be preferably controlled is provided.

Further, in the above described one embodiment, spin movement is performed a plurality of times for a predetermined narrow range, and only when desired target film thickness is not obtained in this range, the condition deriving process is carried out once again, thus making it possible to obtain a desired spin rotational frequency in a comparatively short time.

The present invention is not limited to the above described one embodiment, and various modifications and changes can be made without departing from the spirit of the invention.

For example, in the aforementioned one embodiment, measurement of the resist film thickness is performed in the edge aligner, but this is not restrictive, and it may be performed in the inline film thickness measuring device provided separately from the edge aligner.

Further, in the aforementioned one embodiment, explanation is made with a wafer cited as an example of a substrate, but this is not restrictive, and it may be a glass substrate for a liquid crystal display. Further, the coating solution or coating film is not limited to a resist solution or a resist film.

Furthermore, the aforementioned film thickness–spin rotational frequency correlation may be each prepared for each resist (for each kind of resist set for a solution nozzle) and may be accumulated and stored in the film thickness–spin rotational frequency correlation storage device 315, and this is related (linked) to a plurality of COT process recipes (the target film thickness is included, but the spin rotational frequency is not set) for the resist. According to such configuration, it is not necessary to prepare the film thickness–spin correlation for each process recipe on forming a resist film based on the process recipe.

Further, the above described process recipe may include the setting of whether automatic amendment of the spin rotational frequency is amended or not.

Furthermore, this embodiment can be carried out in combination with the embodiment described first.

As explained thus far, according to the present invention, the film thickness can be controlled with high precision regardless of a change in atmospheric pressure.

The disclosure of Japanese Patent Applications No.2000-70868 filed Mar. 14, 2000 and No.2000-69813 filed Mar. 14, 2000, including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing method for forming a resist film on a substrate with a base film being formed, and performing an exposure processing and a developing processing for the resist film to thereby form a desired resist pattern, comprising:

a base reflected light analyzing step of radiating a light of the same wavelength as an exposure light radiated during the exposure processing to the base film and analyzing a reflected light, before forming the resist film; and a processing condition control step of controlling at least one of a resist film forming condition, a condition for a heating processing performed after the resist film is formed, an exposure processing condition and a developing processing condition, based on an analysis of the reflected light.

2. The method as set forth in claim 1, wherein the processing condition control step includes a step of controlling a resist film thickness formed on the substrate based on the analysis of the reflected light.

3. The method as set forth in claim 2, wherein the step of controlling the resist film thickness controls a rotational frequency of a spin-dry for drying a resist solution by rotating the substrate, which is performed after the resist solution is supplied onto the substrate.

4. The method as set forth in claim 3, wherein the step of controlling the rotational frequency of the spin-dry comprises
a step of obtaining an optimal resist film thickness corresponding to the analysis of the reflected light, and
a step of obtaining the rotational frequency of the spin-dry corresponding to the obtained film thickness.

5. The method as set forth in claim 4,
wherein the step of obtaining the rotational frequency of the spin-dry comprises
a correlation calculating step of forming coating films with a plurality of spin rotational frequencies within a predetermined range and based thereon, obtaining correlation between the spin rotational frequency and the film thickness,
a judging step of judging whether a target film thickness that is the obtained optimal film thickness of the resist film is included in the range of the coating film obtained in the above step, and
a spin rotational frequency calculating step of applying the target film thickness to the correlation when it is judged that the target film thickness is included in the range in the judging step, and obtaining a spin rotational frequency by which the film thickness is achieved.

6. The method as set forth in claim 5,
wherein the judging step includes a step of executing the correlation calculating step once again with the range of the spin rotational frequency being shifted to a range different from the above, when it is judged that the target film thickness is not included in the range.

7. The method as set forth in claim 1,
wherein the processing condition control step includes a step of controlling an exposure amount in the exposure processing based on the analysis of the reflected light.

8. The method as set forth in claim 7,
wherein the control of the exposure amount is performed for each substrate.

9. The method as set forth in claim 7,
wherein the control of the exposure amount is performed for each chip formed on the substrate.

10. The method as set forth in claim 1,
wherein the processing condition control step includes a step of controlling a temperature in a heating processing performed after the resist film is formed, based on the analysis of the reflected light.

11. The method as set forth in claim 1,
wherein the processing condition control step includes a step of controlling a developing time in the developing processing, based on the analysis of the reflected light.

12. The method as set forth in claim 1,
wherein the reflected light analyzing step has a step of detecting a reflectivity of the reflected light, and
wherein the processing condition control step controls at least one of the resist film forming condition, the condition for a heating processing performed after the resist film is formed, the exposure processing condition and the developing processing condition, based on a relation between a previously prepared reflectivity, and at least one of the resist film forming condition, the condition for the heating processing performed after the resist film is formed, the exposure processing condition and the developing processing condition.

13. The method as set forth in claim 1,
wherein the reflected light analyzing step has a step for detecting a film thickness of the base film based on a detected reflected light; and
wherein the processing condition control step controls at least one of the resist film forming condition, the condition for a heating processing performed after the resist film is formed, the exposure processing condition and the developing processing condition, based on a relation between a previously prepared base film thickness, and at least one of the resist film forming condition, the condition for the heating processing performed after the resist film is formed, the exposure processing condition and the developing processing condition.

14. A substrate processing method for forming a resist film on a substrate with a base film being formed, and performing an exposure processing and a developing processing for the resist film to thereby form a desired resist pattern, comprising:
a base reflected light analyzing step of radiating a light of multiple wavelengths to the base film and analyzing a component of the same wavelength as an exposure light radiated during the exposure processing out of the reflected lights before forming the resist film; and
a processing condition control step of controlling at least one of a resist film forming condition, a condition for heating processing performed after the resist film is formed, an exposure processing condition and a developing processing condition, based on the analysis of the reflected light.

15. A substrate processing method for forming a resist film on a substrate with at least a base film being formed and transferring the substrate to an aligner, comprising;
a base reflected light analyzing step for radiating a light of the same wavelength as an exposure light in the aligner and analyzing a reflected light, before forming the resist film;
a step for obtaining an optimal exposure processing condition in the aligner based on an analysis of the reflected light; and
a step of outputting the obtained optimal exposure processing condition to the aligner side.

16. The method as set forth in claim 15,
wherein the obtained optimal exposure condition is an exposure amount per unit time in the aligner.

17. The method as set forth in claim 15,
wherein the base reflected light analyzing step and the step of obtaining the optimal exposure condition perform analysis and calculation for each substrate, and
wherein the output step outputs an identifier of each substrate and an optimal exposure condition obtained for each substrate corresponding to this to the aligner side.

18. The method as set forth in claim 15,
wherein the base reflected light analyzing step and the step of obtaining the optimal exposure condition perform analysis and calculation for each chip of each substrate, and
wherein the output step outputs an identifier of each substrate, an identifier for each chip in each substrate, and an optimal exposure condition obtained for each chip of each substrate corresponding to the identifier for each chip to the aligner side.

19. A substrate processing method for forming a resist film on a substrate with a base film being formed, and performing an exposure processing and a developing processing for the resist film to thereby form a desired resist pattern, comprising:
a step of radiating a light of the same wavelength as an exposure light radiated during the exposure processing to the base film and controlling at least one of a resist film forming condition, and an exposure processing condition based thereon; and a step of measuring a resist film thickness with use of a light of a different wavelength from the exposure light radiated during the exposure processing, after the resist film is formed.

20. A substrate processing method for supplying a coating solution to a substrate while rotating the substrate, spreading the coating solution by a centrifugal force of the rotation, and further rotating the substrate to thereby spin-dry the coating solution, comprising:

a correlation calculating step for forming coating films at a plurality of spin rotational frequencies in a first predetermined range based on a set target film thickness, and based thereon, obtaining a correlation between the spin rotational frequency and the film thickness;

a judging step of judging whether the target film thickness is included in a range of the coating film obtained in the above step;

a spin-dry rotational frequency calculating step of applying the target film thickness to the correlation when it is judged that the target film thickness is included in the range in the judging step, and calculating a spin-dry rotational frequency by which the film thickness is achieved.

21. The method as set forth in claim 20, further comprising a step of executing the correlation calculating step once again with the range of the spin rotational frequency being shifted to a second range different from the first predetermined range, when the target film thickness is not included in the range in the judging step.

22. A substrate processing apparatus for forming a resist film on a substrate with a base film being formed and performing a heat processing therefor, then transferring the substrate to an aligner, and performing a developing processing for the substrate received from the aligner to thereby form a desired resist pattern, comprising:

a base reflected light analyzing device for radiating a light of the same wavelength as an exposure light radiated during an exposure processing to the base film before forming the resist film; and a processing condition controller for controlling at least one of a resist film forming condition, a condition for the heating processing, an exposure processing condition, and a developing processing condition based on an analysis of the reflected light.

23. The apparatus as set forth in claim 22, further comprising a resist film forming unit for supplying a resist solution onto the substrate while rotating the substrate, then stopping a supply of the resist solution, and further rotating the substrate to thereby perform a spin-dry, wherein the processing condition controller controls the rotational frequency of the spin-dry based on the analysis of the reflected light.

24. The apparatus as set forth in claim 22, wherein the processing condition controller controls an exposure amount in the exposure processing based on the analysis of the reflected light.

25. The apparatus as set forth in claim 24, wherein the control of the exposure amount is performed for each substrate.

26. The apparatus as set forth in claim 24, wherein the control of the exposure amount is performed for each chip formed on the substrate.

27. The apparatus as set forth in claim 22, further comprising a heating processing unit for performing the heating processing, wherein the processing condition controller controls a heating temperature in the heat processing unit based on the analysis of the reflected light.

28. The apparatus as set forth in claim 22, further comprising a developing processing unit for supplying a developing solution onto the substrate and performing the developing processing, wherein the processing condition controller controls a developing time in the developing processing unit based on the analysis of the reflected light.

29. The apparatus as set forth in claim 22, wherein the reflected light analyzing device has a detector for detecting a reflectivity of the reflected light; and wherein the processing condition controller has a database of a relation between a previously prepared reflectivity and at least one of the resist film forming condition, the condition for the heating processing, the exposure processing condition and the developing processing condition.

30. The apparatus as set forth in claim 22, wherein the reflected light analyzing device has a detector for detecting a film thickness of the base film based on a detected reflected light; and wherein the processing condition controller has a database of a relation between a previously prepared base film thickness and at least one of the resist film forming condition, the condition for the heating processing, the exposure processing condition and the developing processing condition.

31. A substrate processing apparatus for forming a resist film on a substrate with a base film being formed and performing a heat processing therefor, then transferring the substrate to an aligner, and performing a developing processing for the substrate received from the aligner to thereby form a desired resist pattern, comprising:

a base reflected light analyzing device for radiating a light of multiple wavelengths to the base film and analyzing a component of the same wavelength as an exposure light radiated during an exposure processing, out of reflected lights; and a processing condition controller for controlling at least one of a resist film forming condition, a condition for the heating processing, an exposure processing condition, and a developing processing condition based on an analysis of the reflected light.

32. A substrate processing apparatus for forming a resist film on a substrate with at least a base film being formed and transferring the substrate to an aligner, comprising:

a base reflected light analyzing device for radiating a light of the same wavelength as an exposure light in the aligner and analyzing a reflected light, before the resist film is formed;

an exposure processing condition calculating device for obtaining an optimal exposure processing condition in the aligner based on an analysis of the reflected light; and an output device for outputting the obtained optimal exposure processing condition to the aligner side.

33. The apparatus as set forth in claim 32, wherein the obtained optimal exposure condition is an exposure amount per unit time in the aligner.

34. The apparatus as set forth in claim 32, wherein each substrate is given an identifier of its own;

wherein the base reflected light analyzing device and the exposure processing condition calculating device perform analysis and calculation for each substrate; and wherein the output device outputs the identifier of each substrate and the optimal exposure processing condition obtained for each substrate corresponding to the identifier to the aligner side.

35. The apparatus as set forth in claim 32, wherein each substrate is divided into a plurality of chips;

wherein the base reflected light analyzing device and the exposure processing condition calculating device perform analysis and calculation for each chip of each substrate; and wherein the output device outputs an identifier of each substrate, a positional information for each chip in each substrate, and the optimal exposure processing condition obtained for each chip of each substrate corresponding to the positional information of each chip to the aligner side.

36. A substrate processing apparatus for holding a substrate on a substrate holder rotated by a driving device, supplying a coating solution to the substrate and rotating the substrate, and spreading the coating solution by a centrifugal force of the rotation to thereby form a coating film, comprising a substrate rotation speed setting unit for setting a spin-dry-rotation speed for the coating solution, wherein the rotation speed setting unit comprises:

a target film thickness setting device for setting a target film thickness of the coating film, a spin-dry rotational frequency–film thickness correlation storage device for storing a correlation between the spin-dry rotational frequency and the film thickness of the coating film obtained thereby, and a spin-dry rotational frequency calculating device for applying the target film thickness set by the film thickness setting device to the correlation stored in the spin-dry rotational frequency–film thickness correlation storage device, and calculating the spin-dry rotational frequency for obtaining the target film thickness based thereon.

37. The apparatus as set forth in claim 36, further comprising a film thickness measuring device for measuring the film thickness of the coating film formed by the coating film forming unit, and a correlation calculating device for obtaining a correlation between the rotational frequency and the film thickness of the coating film obtained thereby based on a film thickness of the coating film measured by the film thickness measuring device.

38. The apparatus as set forth in claim 37, wherein the correlation calculating device obtains the correlation based on the film thickness of the coating film formed at each rotational frequency after the coating films are formed at a plurality of spin-dry rotational frequencies in a predetermined range.

39. The apparatus as set forth in claim 37, wherein the film thickness setting device determines whether the target film thickness is included in a range of the film thickness of the coating film obtained at the spin-dry rotational frequencies in the predetermined range, and makes the correlation calculating device obtain the correlation once again with the range of the spin-dry rotational frequency being shifted, when the target film thickness is not included therein.

* * * * *